United States Patent [19]

Shimizu et al.

[11] Patent Number: 4,666,273

[45] Date of Patent: May 19, 1987

[54] AUTOMATIC MAGNIFICATION CORRECTING SYSTEM IN A PROJECTION OPTICAL APPARATUS

[75] Inventors: Hisayuki Shimizu, Yokohama; Satoru Anzai, Zama; Hiroshi Tanaka, Yokohama; Kyoichi Suwa, Yokohama, all of Japan

[73] Assignee: Nippon Kogaku K. K., Tokyo, Japan

[21] Appl. No.: 844,263

[22] Filed: Mar. 25, 1986

Related U.S. Application Data

[63] Continuation of Ser. No. 656,777, Oct. 1, 1984, abandoned.

[30] Foreign Application Priority Data

Oct. 5, 1983 [JP] Japan ............................ 58-186267
May 11, 1984 [JP] Japan ............................ 59-94060

[51] Int. Cl.$^4$ ............................................. G03B 27/42
[52] U.S. Cl. ................................. 353/101; 353/122; 355/55
[58] Field of Search ............. 353/100, 101, 121, 122; 355/53, 54, 55, 56, 43

[56] References Cited

U.S. PATENT DOCUMENTS

| | | | |
|---|---|---|---|
| 3,498,695 | 3/1970 | Brower | 350/418 |
| 3,528,727 | 9/1970 | Holliday | 350/419 X |
| 4,331,388 | 5/1982 | McCrobie et al. | 350/419 |
| 4,506,977 | 3/1985 | Sato et al. | 355/55 X |

Primary Examiner—Harry N. Haroian
Attorney, Agent, or Firm—Shapiro and Shapiro

[57] ABSTRACT

An apparatus for projecting the image of an object onto a substrate comprises light source means for supplying light energy for illuminating the object, optical means for forming the image of the object on the substrate, the image magnification of the optical means being heated and varied by the light energy from the light source means, means for monitoring the manner in which the light energy is applied to the optical means, means for determining the variation in the image magnification of the optical means in response to the monitor means, and means for adjusting the size of the image formed on the substrate in response to the determining means.

24 Claims, 20 Drawing Figures

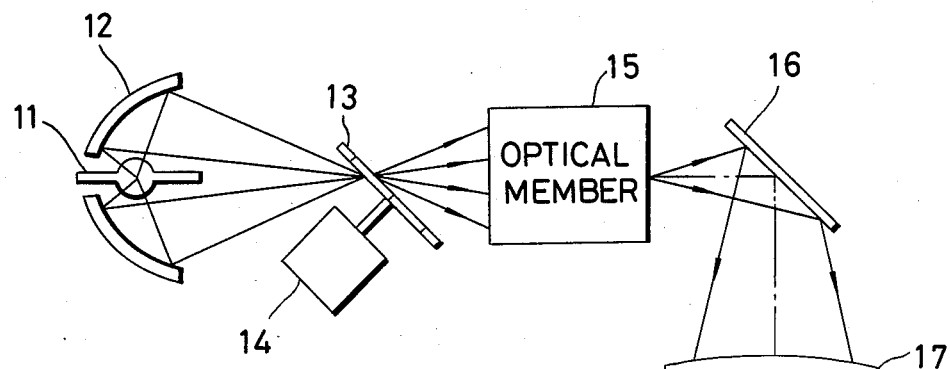
FIG.1
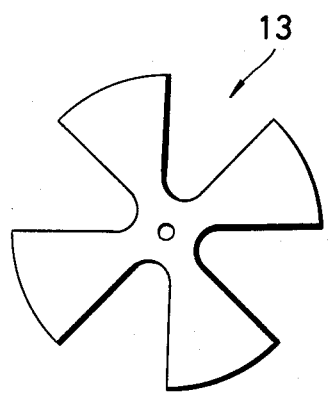
FIG.3
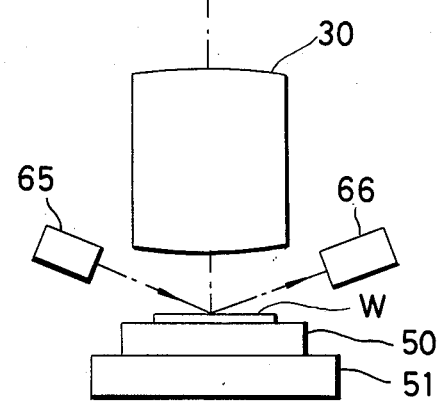

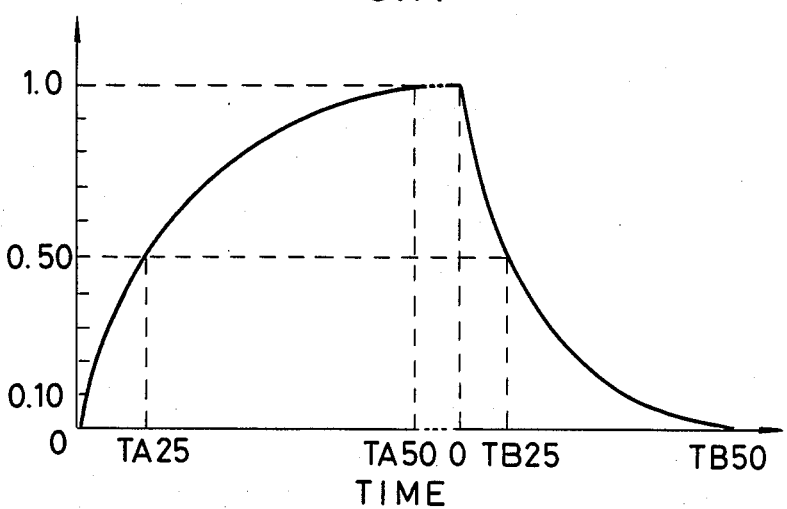
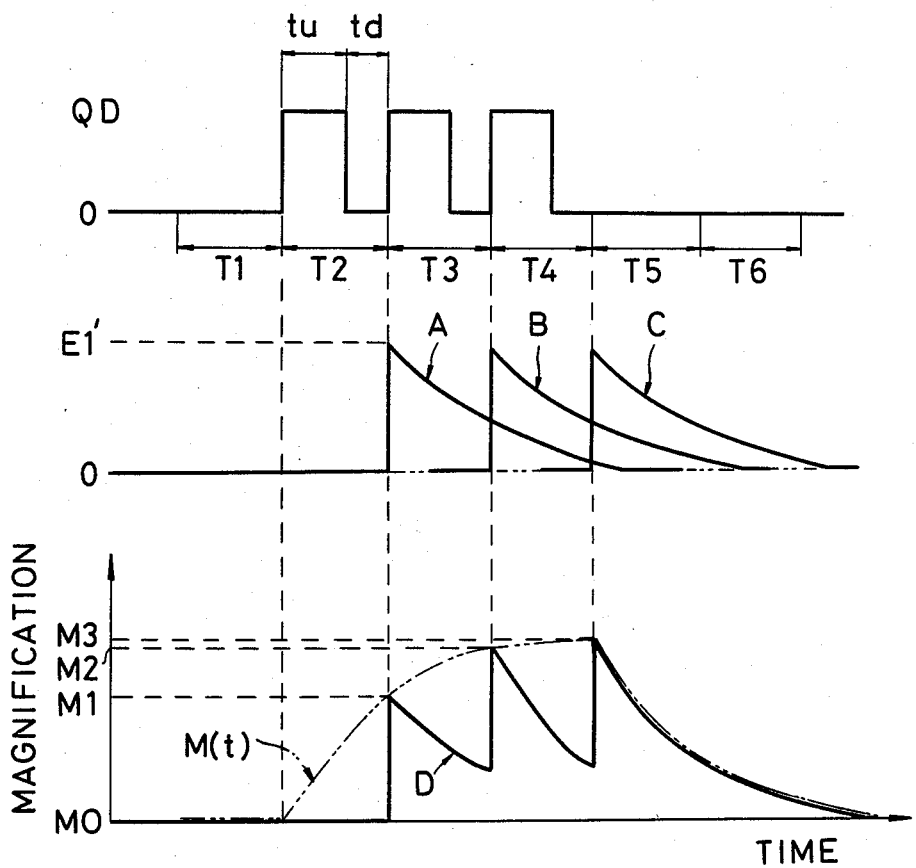

AUTOMATIC MAGNIFICATION CORRECTING SYSTEM IN A PROJECTION OPTICAL APPARATUS

This is a continuation application of Ser. No. 656,777 filed Oct. 1, 1984, now abandoned.

BACKGROUND OF THE INVENTION

1. Field of the Invention

This invention relates to a projection exposure apparatus provided with a projection optical system, and more particularly to an exposure apparatus provided with a projection optical system used to project a minute pattern formed on a photomask or a reticle onto a semiconductive wafer and having the optical characteristic thereof controlled very strictly.

2. Description of the Prior Art

In a projection exposure apparatus for producing semiconductor devices such as super-LSI by a photolithograph including the step of projecting the image of the pattern on the photomask or the reticle onto the semiconductor wafer having photoresist applied thereto, at a predetermined magnification, by the use of a projection lens, matching accuracy is mentioned as one of the important performances thereof. What is important of the factors which affect the matching accuracy is the magnification error of the projection optical system. The size of the pattern used in the super-LSI has had a the strong tendency toward minuteness year by year and along therewith, the need for improved matching accuracy has become stronger. Accordingly, the necessity of keeping the projection magnification at a predetermined value has become very high. At present, the error of the magnification of the projection optical system is made negligible by adjusting it during the installation of the apparatus. However, the projection optical system of the exposure apparatus, for example, the reduction projection lens, absorbs part of illuminating energy and the temperature thereof rises. Therefore, if the illuminating light continues to be applied to the projection lens for a long time or if the exposure operation is continuously effected for a long time, the magnification may vary to an a significant degree. Not only the magnification may fluctuate, but also the position of the imaging plane of the projection lens may fluctuate in the direction of the optic axis. Therefore, if semiconductor devices such as super-LSI are manufactured by the use of an exposure apparatus provided with such a projection optical system, the matching accuracy will be reduced and unsatisfactory resolution by the fluctuation of the imaging plane may result, and this has led to the disadvantage that the yield is substantially reduced.

SUMMARY OF THE INVENTION

It is a primary object of the present invention to automatically correct any fluctuation of the optical characteristic occurring to a projection exposure apparatus.

It is another object of the present invention to stabilize the projection magnification of the projection optical system relative to the variations in the physical factors inside and outside the optical system, particularly the variation in temperature caused by illuminating energy.

The projection optical apparatus of the present invention is constructed so that a signal corresponding to the illuminating energy having entered the projection optical system is produced, the fluctuation of the optical characteristic of the projection optical system to be caused by the illuminating energy, particularly the variation in the projection magnification, is determined on the basis of the signal and the size and/or position of the projected image is controlled into a predetermined state on the basis of the thus determined fluctuation.

In a preferred embodiment of the present invention, control of the size and/or position of the projected image varies the pressure of the gas present in the air space in the projection optical system.

BRIEF DESCRIPTION OF THE DRAWINGS

FIG. 1 shows the optical arrangement of a projection exposure apparatus.

FIG. 3 is a plan view of a rotary shutter.

FIG. 17 is a graph showing the magnification fluctuation characteristic of the projection lens.

FIG. 18 is a time chart showing the incidence time of the exposure light into the projection lens and an output characteristic obtained from the incidence time.

DESCRIPTION OF THE PREFERRED EMBODIMENTS

Figure 2:
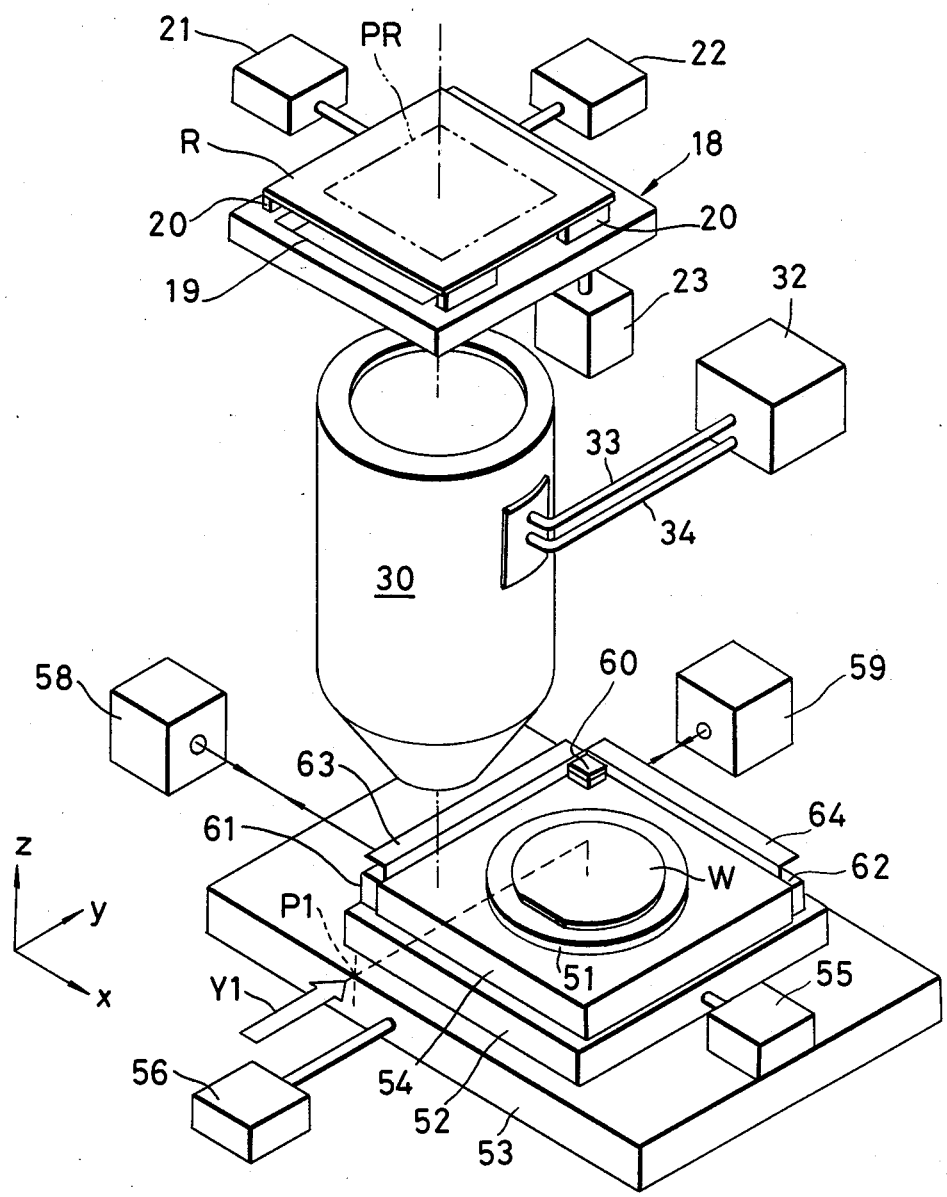
FIG. 2 is a perspective view of the essential portions of the apparatus of FIG. 1.

A projection exposure apparatus according to an embodiment of the present invention will hereinafter be described by reference to FIGS. 1 and 2.

A light source 11 producing light of high brightness, such as a super-high pressure mercury discharge lamp, is disposed at a first focus position of an elliptical reflecting mirror 12, and the light from the light source is condensed at a second focus position of the elliptical reflecting mirror.

A rotary shutter 13 provided with a plurality of radial sectors as shown in FIG. 3 is disposed at the second focus position. Where the sectors have, for example, four blades, transmission and interception of the light from the light source 11 can be changed over each time the shutter 13 is rotated by 45° in one direction. For this purpose, a pulse motor 14 revolves by a predetermined angle (45°) each time the shutter 13 is opened and closed.

Of the light passed through the shutter 13, exposure light of a wavelength suitable for exposing a sensitive material emerges from an optical member 15 while the irregularity of the light intensity distribution by the reflecting mirror 12 is corrected uniformly. For this purpose, the optical member 15 is comprised of an interference filter transmitting the exposure light therethrough or an optical integrator for making the intensity distribution uniform. The exposure light is reflected by a mirror 16 and enters a condenser lens 17, and illuminates a reticle R on which a predetermined pattern by a light-transmitting portion and a light-intercepting portion is depicted, with uniform intensity. Thus, the optical image of the pattern of the reticle R is projected onto a wafer W by a reduction projection lens 30. The reticle R is placed on a reticle stage 18, as shown in FIG. 2. The stage 18 is provided with an opening portion 19 for causing the light passed through the reticle to enter the projection lens 30, and is further provided with a holding portion 20 for vacuum-adsorbing the marginal portion of the reticle. An actuator 21 finely moves the stage in x-direction and an actuator 22 finely moves the stage in y-direction orthogonal to the x-direction and thus, these two actuators effect two-dimensional alignment of the reticle. An actuator 23 moves the stage in z-direction orthogonal to both of the x-direction and the y-direction, i.e., a direction along the optic axis of the projection lens 30, and changes the spacing between the reticle and the projection lens.

On the other hand, the wafer W is placed on a wafer holder 51 provided on a two-dimensionally movable stage 50. The stage 50 is comprised of X, Y and Z stages 52, 53 and 54 driven by actuators 55, 56 and 57 (of which the actuator 57 is not shown in FIG. 2), respectively. Light wave interferometers 58 and 59 using a laser beam are provided to detect the position of the two-dimensionally movable stage. A mirror 61 is provided on one side edge of the Z stage 54 with the reflecting surface thereof extending in the y-direction. A mirror 62 is provided on one side edge of the Z stage 54 with the reflecting surface thereof extending in the x-direction.

The interferometer 58 applies a laser beam to the mirror 61 provided on one side of the Z stage 54 and detects the position of the two-dimensionally movable stage in the x-direction. The interferometer 59 likewise applies a laser beam to the mirror 62 provided on one side of the Z stage 54 and detects the position of the stage in the y-direction. The mirrors 61 and 62 are shielded from the light from the projection lens by shield plates 63 and 64, respectively. The projection lens 30 and the interferometers 58, 59 are disposed so that the two laser beams are orthogonal to each other in the same plane and the optic axis of the projection lens passes through the point of intersection between the two laser beams.

A photoelectric detector 60 is provided on the Z stage 54. The size of the light-receiving surface of the photoelectric detector 60 is equal to or larger than the size of the projected image of an area PR in which the pattern of the reticle R is depicted. This detector 60 is provided so that the position of the light-receiving surface thereof in the z-direction is coincident with the position of the imaging plane of the projection lens 30 in the z-direction. Also, the position of the detector 60 on the Z stage is determined as follows. Where the wafer W is conveyed from a direction indicated by arrow $Y_1$ in FIG. 1 and delivered onto the wafer holder 51 at a position $P_1$, the two-dimensionally movable stage is positioned so that the center of the wafer holder 51 lies at the position $P_1$. At this time, the projected optical image of the area PR on the reticle projected by the projection lens is coincident with the light-receiving surface of the detector 60. The then position of the two-dimensionally movable stage will hereinafter be referred to as the loading position.

A projector 65 shown in FIG. 1 obliquely applies an imaging light beam for forming the image of a pin-hole, a slit or the like on the surface of the wafer W. A photosensor 66 photoelectrically detects the reflected light of that light beam from the wafer W and produces a detection signal corresponding to the reflected position thereof. The imaged position of the light beam from the projector 65 is pre-adjusted so as to be coincident with the imaging plane of the projection lens. The deviation of the surface of the wafer W in the direction of the optic axis with respect to the imaging plane of the projection lens is detected by the projector 65 and the photosensor 66.

The projection lens 30 is provided with an optical characteristic control device 32 for minutely varying optical characteristics such as projection magnification and focus position (position of the imaging plane). This control device 32 changes the pressure of the gas (air or the like) enclosed in the particular space between a plurality of optical lenses constituting the projection lens and changes the refractive index of that space, thereby varying the magnification and the focus position. Here, two hermetically sealed spaces are provided in the projection lens and the pressure of one of these spaces is controlled through a pipe 33 to thereby vary the magnification chiefly and the pressure of the other space is controlled through a pipe 34 to thereby vary the focus position chiefly.

Let it be assumed that one of the lens spacings of the projection lens is an air chamber isolated from the atmosphere and that when the air pressure in this air chamber is varied by a unit pressure from the initial magnification setting time, the amount of variation in magnification, namely, the amount of variation in the predetermined off-axis image point on the imaging plane, is $\Delta X_1$. Also, let it be assumed that the pressure of the air space other than this air chamber varies substantially equally to the atmospheric pressure and that in the entire space except this air chamber, the amount of variation in magnification for a variation in the unit pressure in atmospheric pressure is $\Delta X$. Assuming that at this time, there is a variation of $\Delta P$ in the atmospheric pressure, the variation in magnification can be corrected by varying the air pressure in the air chamber by $\Delta P_1$ and satisfying the following relation:

$$\Delta P_1 \cdot \Delta X_1 + \Delta P \cdot \Delta X = 0 \qquad (1)$$

However, correction of magnification is possible by the control of the air pressure only in one air chamber, but it is difficult to correct the fluctuation of the imaging plane at the same time. It is therefore desirable to provide also a second air chamber isolated from the atmosphere. In this case, assuming that the amount of variation in the imaging plane for the variation in the unit pressure in the first air chamber is $\Delta Z_1$ and the amount of variation in magnification and the amount of variation in the imaging plane for the variation in the unit pressure in the second air chamber are $\Delta X_2$ and $\Delta Z_2$, respectively, the pressure in the first air chamber and the pressure in the second air chamber are varied by $\Delta P_1$ and $\Delta P_2$, respectively, so as to satisfy the following two conditions at the same time:

$$\Delta P_1 \cdot \Delta X_1 + \Delta P_2 \cdot \Delta X_2 + \Delta P \cdot \Delta X = 0 \quad (2)$$

$$\Delta P_1 \cdot \Delta Z_1 + \Delta P_2 \cdot \Delta Z_2 + \Delta P \cdot \Delta Z = 0 \quad (3),$$

whereby the fluctuations of the magnification and the imaging plane occurring in the remaining air chambers can be easily corrected.

Figure 4:
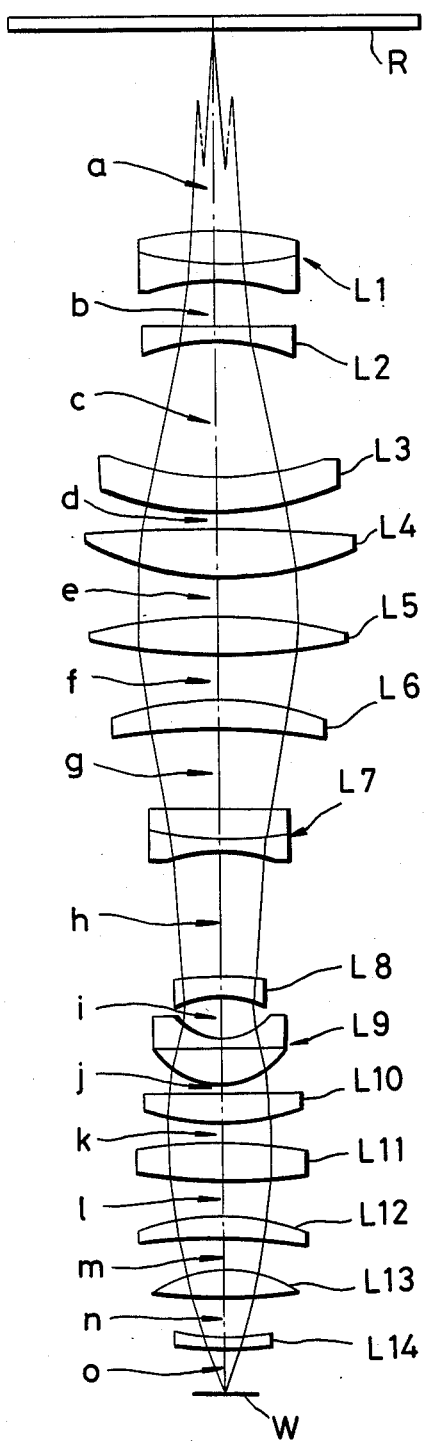
FIG. 4 shows a specific lens arrangement of a projection lens.

The arrangement of the optical elements of the projection lens is shown in FIG. 4. In FIG. 4, there is shown a light ray representative of the conjugate relation of the on-axis object point between the wafer and the reticle.

This projection lens comprises fourteen lenses $L_1$, $L_2$, ..., $L_{14}$ in succession from the reticle R side, and fifteen air spaces a, b, c, ..., o are formed between the reticle R and the wafer W in succession from the reticle side. The numerical data of this projection lens are shown in Table 1 below. In Table 1, r represents the radius of curvature of each lens surface, D represents the center thickness and air space of each lens, N represents the refractive index of each lens for the i-line (wavelength 365.0 nm), and the numbers at the left end of the table represent the order of the lenses from the reticle side. $D_0$ represents the spacing between the reticle R and the foremost lens surface, and $D_{31}$ represents the spacing between the last lens surface and the wafer W. Assuming that in this projection lens, the air pressure in each of the air spaces a, b, ..., o is varied by +137.5 mm Hg, the relative refractive index of each air space changes to 1.00005, and the variation $\Delta X$ in magnification and the variation $\Delta Z$ in the imaging plane, i.e., the plane conjugate with the reticle R, at this time, are such as shown in Table 2 below. In Table 2, the variation $\Delta X$ in magnification represents, in $\mu m$ units, the amount by which the image point imaged at a position spaced apart by 5.66 mm from the optic axis on the imaging plane, before the air pressure in each air space fluctuates, moves after the air pressure in each air space varies, and the case (enlargement) where the image point is projected more largely on the imaging plane, i.e., the predetermined wafer surface, when there is no fluctuation of the air pressure, than in the case of a predetermined magnification is shown as the positive sign. Also, the variation $\Delta Z$ in the imaging plane represents the variation in the on-axis imaging point in $\mu m$ units, and the case where the imaging point goes away from the projection lens is shown by the positive sign.

TABLE 1

| No. | r | D | N | | |
|---|---|---|---|---|---|
| | | $D_0 = 259.78958$ | 1.000000 | | a |
| 1 | 143.86900 | 9.97570 | 1.504150 | $\Big\}\ L_1$ | |
| 2 | −81.46300 | 3.42920 | 1.602500 | | |
| 3 | 51.49700 | 14.02840 | 1.000000 | | b |
| 4 | 540.12700 | 4.98790 | 1.602500 | $L_2$ | |
| 5 | 62.56200 | 41.77340 | 1.000000 | | c |
| 6 | −68.02600 | 9.66400 | 1.562260 | $L_3$ | |
| 7 | −74.29500 | 4.05260 | 1.000000 | | d |
| 8 | 1.355.17400 | 15.58710 | 1.504150 | $L_4$ | |

TABLE 1-continued

| No. | r | D | N | | |
|---|---|---|---|---|---|
| 9 | −73.55600 | 10.28750 | 1.000000 | | e |
| 10 | 135.96800 | 10.59920 | 1.536390 | $L_5$ | |
| 11 | −200.04700 | 13.09320 | 1.000000 | | f |
| 12 | 81.78000 | 9.35230 | 1.562260 | $L_6$ | |
| 13 | 160.24400 | 24.00410 | 1.000000 | | g |
| 14 | −463.01200 | 9.66400 | 1.536390 | $\Big\}\ L_7$ | |
| 15 | −146.45400 | 2.80570 | 1.602500 | | |
| 16 | 64.24100 | 34.91510 | 1.000000 | | h |
| 17 | 49.49500 | 8.41700 | 1.627530 | $L_8$ | |
| 18 | 30.04000 | 11.22270 | 1.000000 | | i |
| 19 | −16.99700 | 2.49390 | 1.602500 | $\Big\}\ L_9$ | |
| 20 | 351.55900 | 11.53450 | 1.504150 | | |
| 21 | −22.57200 | 1.24700 | 1.000000 | | j |
| 22 | −654.15900 | 9.97570 | 1.504150 | $L_{10}$ | |
| 23 | −74.32800 | 4.75150 | 1.000000 | | k |
| 24 | 153.24500 | 11.53450 | 1.536390 | $L_{11}$ | |
| 25 | −275.84600 | 8.72880 | 1.000000 | | l |
| 26 | 50.46800 | 7.17010 | 1.562260 | $L_{12}$ | |
| 27 | 144.70600 | 10.91100 | 1.000000 | | m |
| 28 | 41.10500 | 7.27400 | 1.562260 | $L_{13}$ | |
| 29 | −387.53000 | 11.22270 | 1.000000 | | n |
| 30 | −95.33700 | 3.11740 | 1.627530 | $L_{14}$ | |
| 31 | −291.36200 | | 1.000000 | | o |
| | $D_{31} = 12.46970$ | | | | |

TABLE 2

| Nos. of spaces | | $\Delta X(\mu m)$ | $\Delta Z(\mu m)$ |
|---|---|---|---|
| 1 | a | +0.031 | 0.37 |
| 2 | b | +0.038 | −0.49 |
| 3 | c | +1.164 | −2.47 |
| 4 | d | −1.173 | 3.05 |
| 5 | e | −2.086 | 5.65 |
| 6 | f | −1.388 | 4.19 |
| 7 | g | +0.194 | −0.93 |
| 8 | h | +0.131 | −0.03 |
| 9 | i | +0.116 | −4.80 |
| 10 | j | +0.143 | 4.04 |
| 11 | k | +0.127 | 2.06 |
| 12 | l | +0.224 | 2.06 |
| 13 | m | +0.136 | 0.89 |
| 14 | n | −0.008 | 0.62 |
| 15 | o | −0.012 | 0.65 |
| Entire system | | +1.004 | 14.83 |

It will be seen from Table 2 above that the variation in the imaging plane by the eighth space h is smallest, that the eighth space h is best suited for being the air space for magnification correction, that the variation in magnification by the fourteenth space n is smallest and that the fourteenth space is best suited for correcting the position of the imaging plane. Thus, the eighth space h and the fourteenth space n are made into air chambers isolated from the atmosphere, and by controlling the pressure in these air chambers, correction of magnification and correction of the imaging plane are effected. The spaces other than the eighth space h and the fourteenth space n are not isolated from the atmosphere but are designed to vary with the atmospheric pressure. If the aforementioned equations (2) and (3) are rewritten, the conditions for effecting the correction of magnification and of the imaging plane by the fluctuation of the atmospheric pressure in the above-described projection lens will be as follows:

$$\Delta Ph \cdot \Delta Xh + \Delta Pn \cdot \Delta Xn + \Delta P \cdot \Delta X = 0 \quad (4)$$

$$\Delta Ph \cdot \Delta Zh + \Delta Pn \cdot \Delta Zn + \Delta P \cdot \Delta Z = 0 \quad (5),$$

where ΔPh is the variation in the pressure in the eighth space h, ΔXh is the amount of variation in magnification for the unit variation in the pressure in the eighth space h, ΔZh is the variation in the imaging plane for the unit variation in the pressure in the eighth space h, ΔPn is the variation in the pressure in the fourteenth space n, ΔXn is the variation in magnification for the unit variation in the pressure in the fourteenth space n, and ΔZn is the variation in the imaging plane for the unit variation in the pressure in the fourteenth space n. The unit of variation in pressure is mmHg, and the unit of variation in magnification and variation in the imaging plane is μm/mmHg. In Table 2, the variation in magnification and the variation in the imaging plane when the variation in the pressure in each space is +137.5 mmHg are shown and therefore, if ΔXh, ΔXn, ΔX, ΔZh, ΔZn and ΔZ in equations (4) and (5) are to be found from this, equations (4) and (5) may be rewritten as follows:

$$9.53 \times 10^{-4} \times \Delta Ph - 5.82 \times 10^{-5} \times \Delta Pn + 6.41 \times 10^{-3} \times \Delta P = 0 \quad (6)$$

$$-2.19 \times 10^{-4} \times \Delta Ph + 4.51 \times 10^{-3} \times \Delta Pn + 1.04 \times 10^{-1} \times \Delta P = 0 \quad (7)$$

If ΔPh and ΔPn which will satisfy both of equations (6) and (7) are to be found, the following will be obtained:

$$\Delta Ph = -8.2 \Delta P \quad (8)$$

$$\Delta Pn = -23.5 \Delta P \quad (9)$$

to take one example more specifically, when the fluctuation of the atmospheric pressure is −10 mmHg, if the eighth space is pressurized by 82 mmHg and the fourteenth space is pressurized by 235 mmHg, the variation in magnification and the variation in the imaging plane by the fluctuation of the atmospheric pressure can both the corrected.

Figure 5:
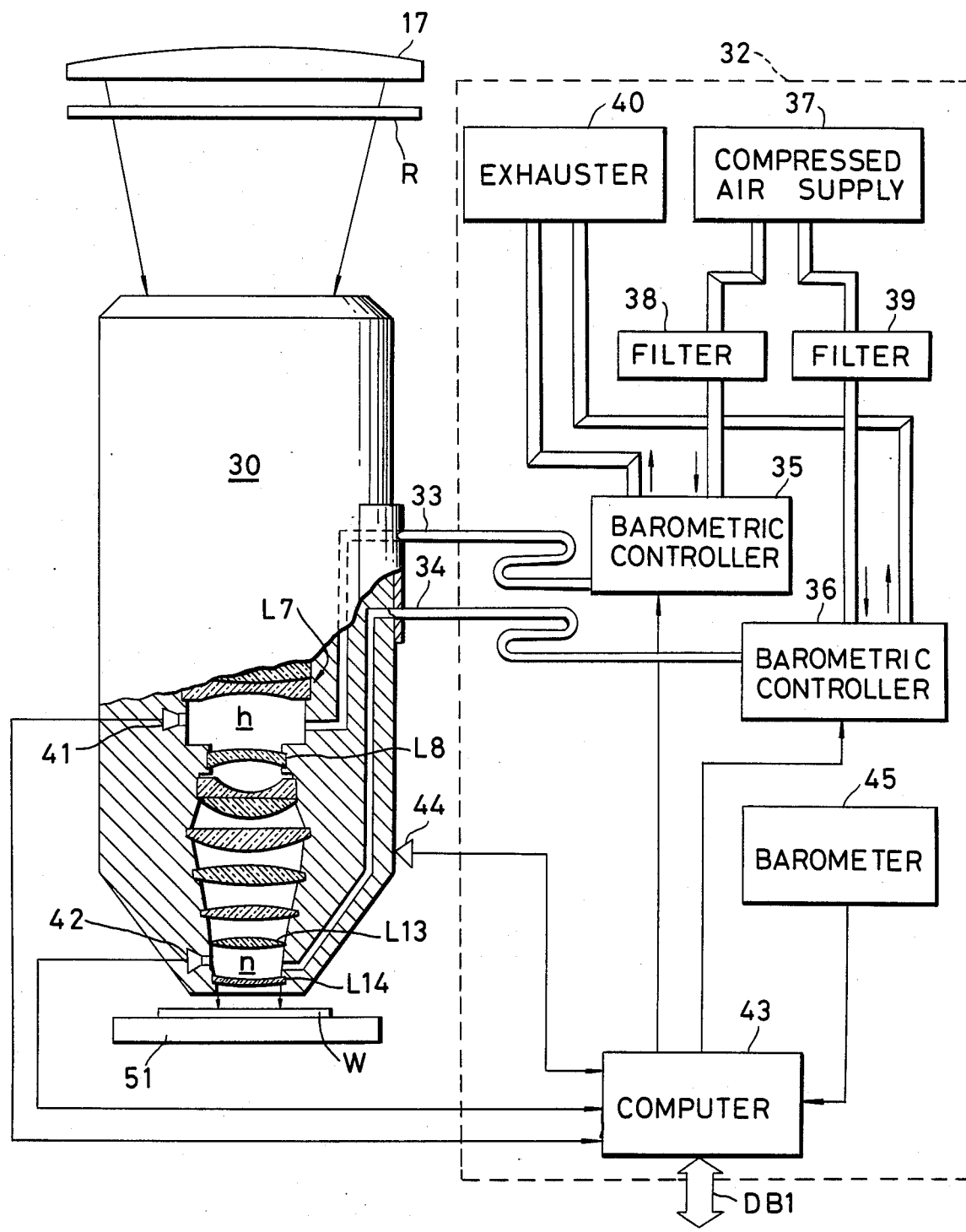
FIG. 5 is a view, partly in cross-section, of a projection exposure apparatus provided with a pressure control device.

FIG. 5 schematically shows the construction of the optical characteristic control device 32. The air chamber h corresponding to the eighth space and the air chamber n corresponding to the fourteenth space are formed as spaces independent of the outside by lenses L7, L8 and L13, L14 and the inner wall of the housing, and are connected to barometric controllers 35 and 36, respectively, through pipes 33 and 34, respectively. Air or nitrogen gas at a predetermined pressure is steadily supplied from a compressed air supply source 37 to the barometric controllers 35 and 36 through filters 38 and 39, respectively, and an exhauster 40 for exhausting the gas is connected to the barometric controllers 35 and 36. On the other hand, pressure sensors 41 and 42 for detecting the pressures in the air chambers are provided on the sides of the respective air chambers, and the output signals thereof are sent to a computer 43. The projection lens is provided with a temperature sensor 44 for detecting the temperature in the lens barrel, and the output signal thereof is also sent to the computer 43. Further, there is provided a barometer 45 which produces an output signal corresponding to the atmospheric pressure, and the output signal thereof is sent to the computer 43.

The computer 43, as previously described, has prestored therein the amounts of variation in magnification ΔXh and ΔXn per unit pressure in the air chambers h and n, the amounts of variation in the imaging plane ΔZh and ΔZn, the amount of variation in magnification ΔX per unit pressure of the atmospheric pressure and the amount of variation in the imaging plane ΔZ. The computer 43 detects the amount of variation in atmospheric pressure ΔP by the signal from the barometer 45, calculates the variations in pressure ΔPh and ΔPn necessary for the respective air chambers to satisfy the aforementioned equaitons (4) and (5), and produces signals for effecting these variations in pressure within the barometric controllers 35 and 36. The barometric controllers 35 and 36 control the flow rate of gas on the basis of these signals and provide the variations in pressure ΔPh and ΔPn to the respective air chambers.

Each of the barometric controllers 35 and 36 has a first needle valve for controlling the flow rate of the gas of high pressure from the compressed air supply source 37, a second needle valve for controlling the flow rate of the gas exhausted by the exhauster 40, and a driver for controlling the amount of opening and closing of each needle valve in response to the signal from the computer 43.

As described above, the computer 43 has the function of preparing the data for correcting the magnification fluctuation and the focus fluctuation (the fluctuation of the imaging plane in the direction of the optic axis AX) resulting from the fluctuation of the atmospheric pressure. Further, fluctuation of optical characteristics occurs due to the exposure light passing through the projection lens, and for the correction of such fluctuation, the computer 43 receives various types of information for determining the actual variations in pressure ΔPh and ΔPn, from a control system for controlling the operation of the entire exposure apparatus, through a data bus DB1.

Figure 6:
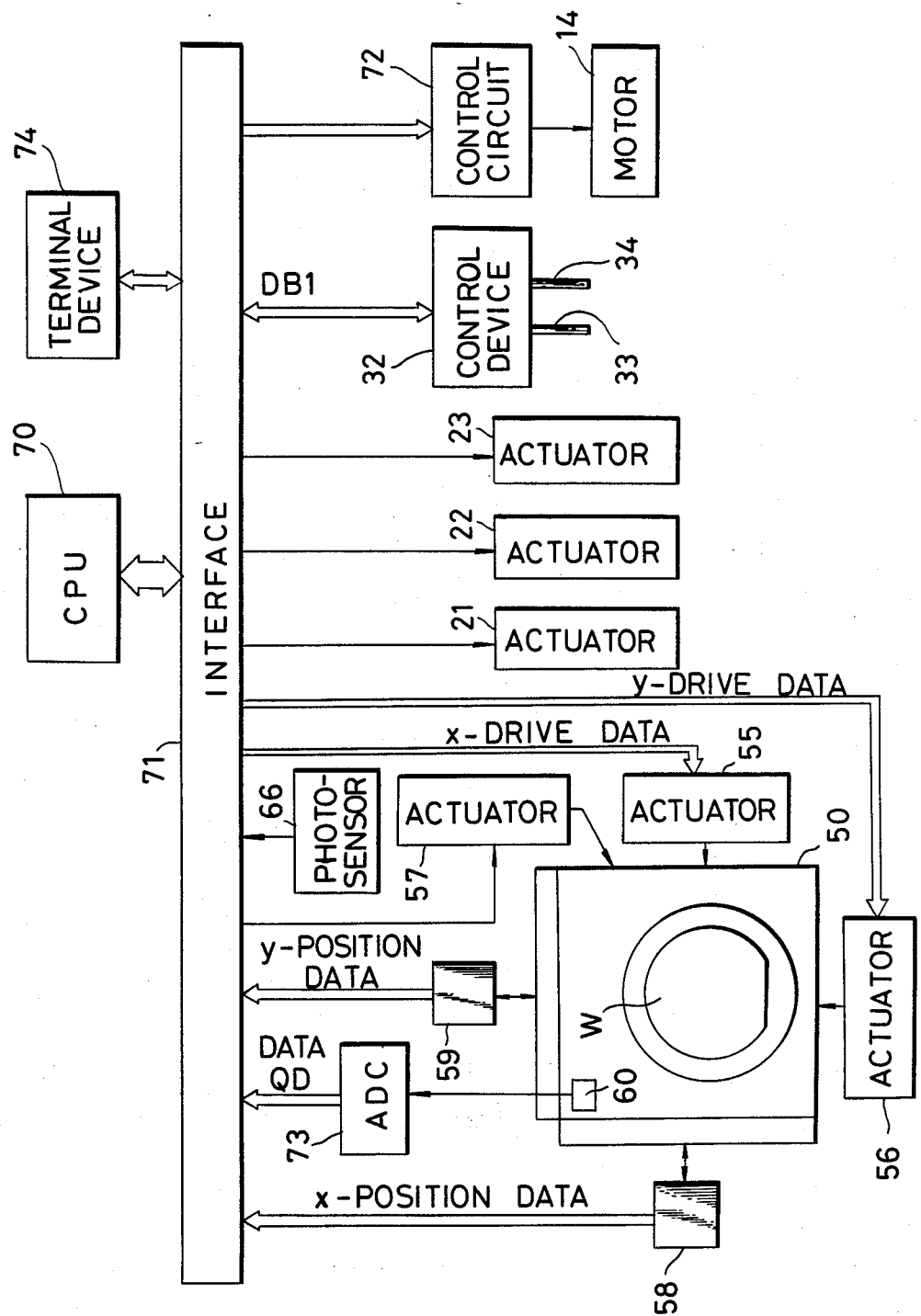
FIG. 6 is a block diagram of a control system for controlling the entire projection exposure apparatus.

Referring to FIG. 6, there is shown the control system for controlling the entire exposure apparatus. The sequence and operations of the entire system are generally controlled by a central processing unit 70 including memories (RAM and ROM). The outputting of information to each actuator and the inputting of information from detectors or the like are effected through an interface 71.

The detection data of a laser interferometer 58 for detecting the position of the two-dimensionally movable stage 50 in the x-direction and the detection data of a laser interferometer 59 for detecting the position of the two-dimensionally movable stage 50 in the y-direction are read into the CPU 70 through the interface 71. The CPU operates the value of the coordinates of the movable stage 50 on the basis of these detection data.

The drive data put out from the CPU through the interface 71 are input to actuators 55 and 56, and the movable stage 50 is moved in the x-direction and y-direction by amounts corresponding to the drive data. On the other hand, movement of the reticle R in the x-direction, y-direction and z-direction is effected by operating actuators 21, 22 and 23 by the command from the CPU 70.

A control device 32 also effects exchange of information with the CPU. The pulse motor 14 for driving the rotary shutter 13 is controlled by a shutter control circuit 72, and the information regarding the opening timing and the closing timing of the shutter 13 is sent from the CPU.

The photoelectric signal of the photoelectric detector 60 provided on the movable stage 50 is converted into a digital value by an analog-digital converter 73 including an amplifier, and the data QD thereof is read into the CPU. Further, a terminal device 74 provided with a keyboard and a display CRT to provide a command of operation to the CPU and monitor the operative situation is also connected to the interface 71 and effects communication between the operator and the device.

The detection signal put out by the photosensor 66 shown in FIG. 1 is representative of the position of the wafer W in the Z-direction and is read into the CPU. This detection signal, when the value thereof is positive, represents the fact that the surface of the wafer W has been positioned on the projection lens side rather than on the imaging plane of the projection lens, and when the value thereof is negative, represents the fact that the surface of the wafer W has been positioned in spaced apart relationship with the projection lens with respect to the imaging plane thereof, and when the value thereof is zero, represents the fact that the surface of the wafer W has become coincident with the imaging plane. Thus, the CPU determines the amount of movement of the Z stage in the Z-direction on the basis of this detection signal, and puts out to an actuator 57 a signal corresponding to that amount of movement. In this manner, the projected image of the pattern of the reticle R is always exposed while being focused on the wafer W.

An automatic focusing apparatus is constituted by the projector 65, the photosensor 66, the CPU, the actuator 57 and the Z stage 54.

Figure 7:
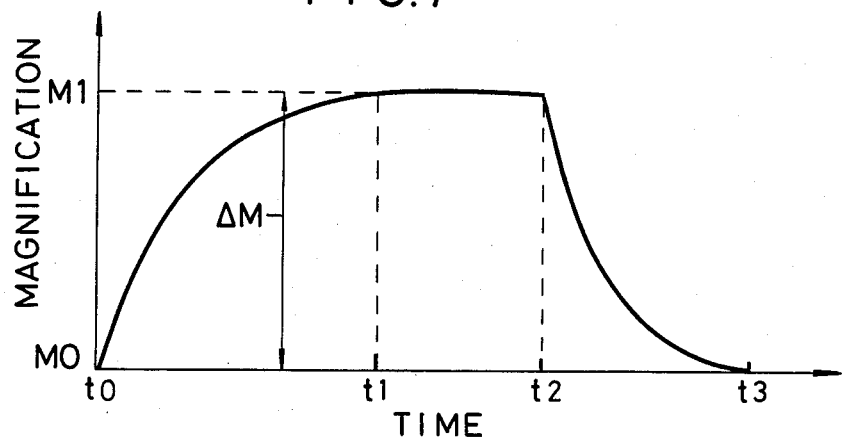
FIG. 7 is a graph showing the magnification fluctuation characteristic of the projection lens.

As previously described, the magnification of the projection lens fluctuates by a minute amount when the exposure light passes therethrough. That is, fluctuation of the magnification is caused by the refractive index, etc. of the optical system in the projection lens being varied by temperature. When the fluctuation of the magnification of the projection lens 30 by the application of the exposure light has been measured by the use of the apparatus shown in FIG. 2, a characteristic as shown in FIG. 7 has been obtained as an example. However, it is to be understood that at this time, the fluctuation $\Delta P$ of the atmospheric pressure is negligibly small.

In FIG. 7, the abscissa represents time and the ordinate represents the magnification of the projection lens. When the initial magnification of the projection lens 30 is $M_0$ and the shutter 13 is opened at time $t_0$, the magnification fluctuates with time and is stabilized to a predetermined magnification M, at time $t_1$. Even if the shutter is continuedly opened thereafter to permit the exposure light to enter the projection lens, the magnification does not fluctuate from $M_1$. This means that the energy which is absorbed by the projection lens and provides heat and the heat energy emitted from the lens assume the same amount and have become balanced. When the shutter 13 is closed at time $t_2$, the magnification restores its initial value from the magnification $M_1$ with time and assumes the initial magnification $M_0$ at time $t_3$. When the amount of fluctuation from the magnification $M_0$ to the magnification $M_1$ is $\Delta M$, the amount of fluctuation $\Delta M$ is varied by the rate of the light-transmitting portion to the size of the pattern area Pr of the reticle R, that is, the transmission factor of the reticle, and the intensity of the light from the light source.

However, the time constant TS1 during the socalled rising from time $t_0$ till time $t_1$ and the time constant TS2 during the so-called falling from time $t_2$ till time $t_3$ are always constant irrespective of the quantity of exposure light entering the projection lens. These time constants TS1 and TS2 are equivalent to the time constant in the heat transfer characteristic of the projection lens, and exhibit values inherent to the projection lens. The time constants TS1 and TS2 differ depending on the type of the lens and as a result of measurement, it has been found that they are in the range of 300–600 sec. Further, during both the rising and the falling, they exhibit a fluctuation similar to the characteristic of on exponential function. That is, the characteristic during the rising is approximated by $$\Delta M \cdot \left(1 - e^{-\frac{t}{TS1}}\right) \quad (10)$$

and the characteristic during the falling is approximated by $$\Delta M \cdot e^{-\frac{t}{TS2}}. \quad (11)$$

Figure 8:
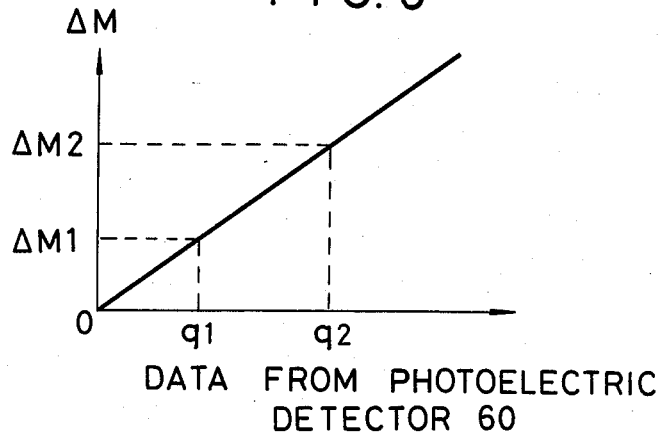
FIG. 8 is a graph showing the relation between the quantity of exposure light entering the projection lens and the magnification fluctuation amount.

(In the above formulas, e is a natural number.) In formula (10), t is the lapse time from time $t_0$ till $t_2$ in FIG. 7, and in formula (11), t is the lapse time from time $t_2$. On the other hand, the general quantity of exposure light entering the projection lens including the pattern size, the transmission factor and the intensity of light is detected by the photoelectric detector 60. When the relation between the data of the quantity of incident light detected by the photoelectric detector 60 and the magnification fluctuation amount $\Delta M$ is measured, it exhibits a substantially linear characteristic as shown in FIG. 8. Now, consider a case where for example, two reticles of transmission factors 10% and 50%, respectively, are successively exposed to light under the conditions in which both of the pattern size and the intensity of the light from the light source are constant. In the case of the exposure of the reticle of transmission factor 10%, the value of the data QD from the detector 60 is $q_1$ and the saturated value of the magnification fluctuation amount thereof is $\Delta M_1$. Next, in the case of the exposure of the reticle of transmission factor 50%, it can be seen beforehand that the value of the data QD is $q_2$ and the saturated value of the magnification fluctuation amount is $\Delta M_2$.

Therefore, the design is such that the pressure in the air chamber h of the projection lens is controlled by the CPU and the control device 32 so that the fluctuation of the projection magnification caused by the passage of the exposure light may be prevented on the basis of the quantity of light entering the projection lens 30 detected by the photoelectric detector 60 and a predetermined magnification may always be maintained.

Generally, in the projection exposure apparatus of this type, the reduced image of the pattern of the reticle R is repetitively projected onto a plurality of positions on the wafer W. Therefore, a duty detecting circuit for detecting the duties of the time during which the exposure light passes through the projection lens and the time during which the exposure light does not pass through the projection lens is provided, for example, in the shutter control circuit 72 or the interface 71 of FIG. 6.

Figure 9:
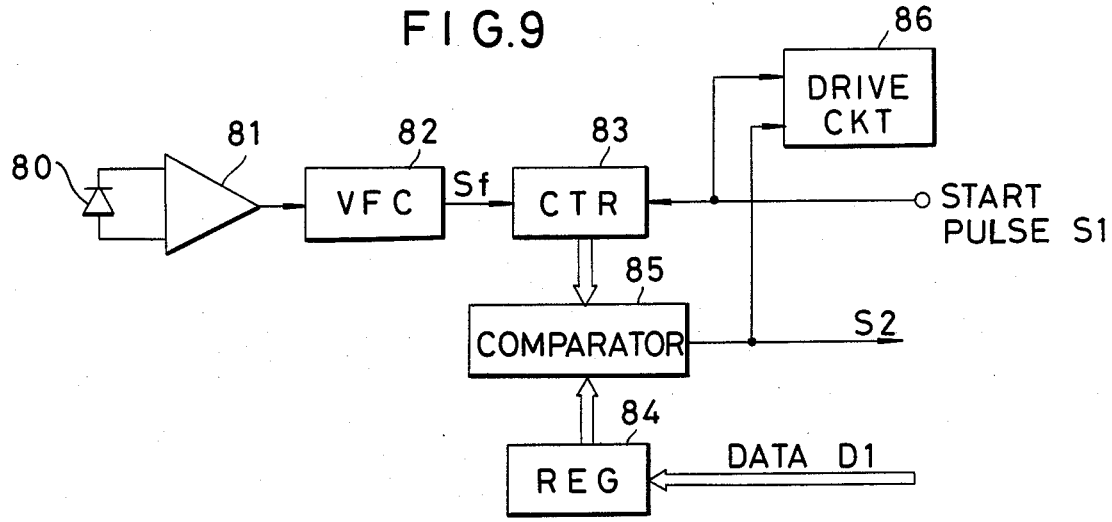
FIG. 9 is a block diagram of a shutter control circuit.
Figure 10:
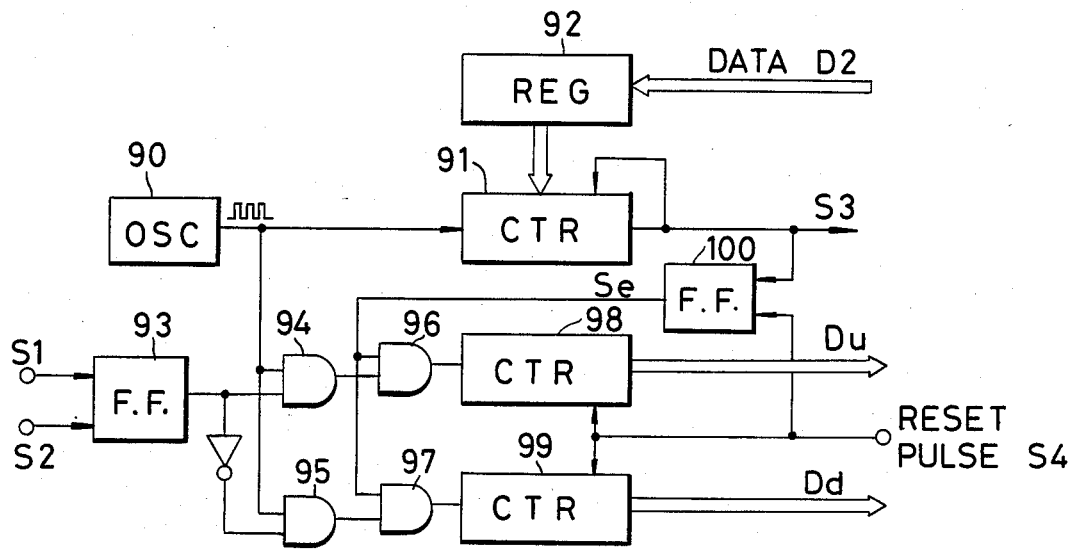
FIG. 10 is a block diagram of a duty detecting circuit.

A specific example of the shutter control circuit 72 is shown in FIG. 9, and a specific example of the duty detecting circuit is shown in FIG. 10. In FIG. 9, a light-receiving element 80 is disposed between the condenser lens 17 shown in FIG. 1 and the reticle R so as not to shield the pattern area Pr from light and puts out a photoelectric signal corresponding to the intensity of the exposure light which illuminates the reticle R. An amplifier 81 amplifies the photoelectric signal of the light-receiving element 80, and a voltage-frequency converter 82 puts out a pulse signal Sf of a frequency corresponding to the magnitude of the voltage of the amplified photoelectric signal. A counter 83 counts the pulse signal Sf and clears the count content to zero in response to the start pulse $S_1$ from the CPU 70. A data $D_1$ put out from the CPU is a target value for providing a proper exposure amount to the wafer W, and this data $D_1$ is set in a register 84.

A comparator 85 compares the count value of the counter 83 with the target value of the register 84 and puts out a coincidence pulse $S_2$ when the two values are coincident with each other.

A drive circuit 86 supplies a drive pulse for effecting predetermined revolution to the pulse motor 14 for rotating the shutter 13, revolves the pulse motor 14, for example, by 45° in response to the start pulse $S_1$ to thereby open the shutter and further revolves the pulse motor by 45° in response to the coincidence pulse $S_2$ to thereby close the shutter.

Thus, when the shutter is opened in response to the start pulse $S_1$ and a proper exposure amount provided by the data $D_1$ is obtained, the shutter is closed in response to the coincidence pulse $S_2$ and therefore, the CPU may set the data $D_1$ and control the timing at which the start pulse $S_1$ is generated.

The duty detecting circuit of FIG. 10 detects the time during which the shutter 13 is opened and the time during which the shutter is closed, during a predetermined time interval.

An oscillator 90 puts out a clock signal always of a predetermined frequency. As regards the clock signal, time and pulse number are proportional to each other so that for example, ten pulses or one hundred pulses are generated per second. A counter 91 subtracts the pulse number of the clock signal from the initial value set in a preset register 92, and puts out a zero signal $S_3$ when the count value thereof becomes zero. This counter 91 is responsive to the zero signal $S_3$ to re-set the initial value set in the preset register 92. The initial value set in the preset register 92 is determined by a data $D_2$ put out from the CPU.

On the other hand, a flip-flop 93 receives the aforementioned start pulse $S_1$ and coincidence pulse $S_2$ as inputs, and assumes a logic value "H" in response to the inputting of the start pulse $S_1$ and puts out a logic value "L" in response to the inputting of the coincidence pulse $S_2$. An AND gate 94 receives the output of the flip-flop 93 and the clock signal as inputs, and puts out the clock signal during the time that the flip-flop assumes the logic value "H". An AND gate 95 puts out the clock signal during the time that the output of the flip-flop 93 assumes the logic value "L".

The output signal of the AND gate 94 is input to a counter 98 through an AND gate 96, and the counter 98 counts the pulses of the clock signal. Also, the output signal of the AND gate 95 is input to a counter 99 through an AND gate 97, and the counter 99 counts the pulses of the clock signal. These two counters 98 and 99 are both cleared to zero in response to the reset pulse $S_4$ from the CPU. A flip-flop 100 puts out a signal Se inverted into the logic value "L" in response to the inputting of the zero signal $S_3$ and inverted into the logic value "H" in response to the inputting of the reset pulse $S_4$.

In such a construction, the CPU 70 reads the count value Du of the counter 98 and the count value Dd of the counter 99 in response to the zero signal $S_3$, and immediately thereafter puts out the reset pulse $S_4$. Therefore, the flip-flop 100 and the AND gates 96, 97 inhibit the inputting of the clock signal to the counters 98 and 99 during the time that the CPU reads the count values Du and Dd. However, where the clock signal reading time is very short relative to the time of one pulse interval of the clock signal, the flip-flop 100 and the AND gates 96, 97 may be eliminated.

Operation of the exposure apparatus according to the present embodiment will now be described.

Figure 11:
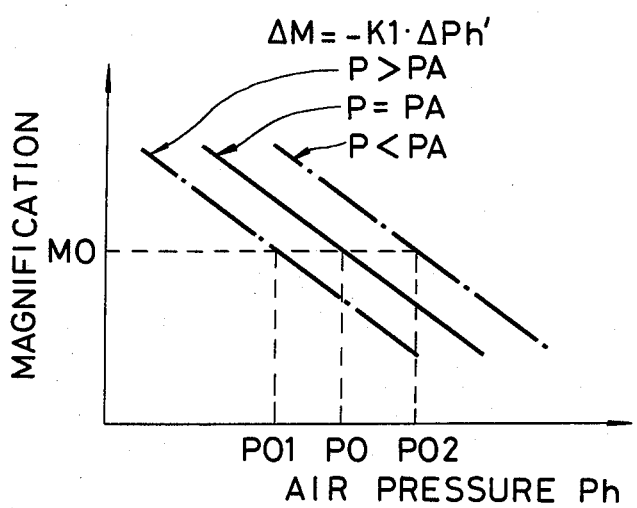
FIG. 11 is a graph showing the relation between the magnification of the projection lens and the pressure in an air chamber.

The initial magnification $M_0$ of the projection lens and the initial pressure $P_0$ in the air chamber h providing the magnification $M_0$ are pre-measured during the manufacture of the exposure apparatus. Also, it is found in advance by measurement that the fluctuation amount $\Delta Ph'$ of the pressure in the air chamber h relative to the fluctuation amount $\Delta m$ of the magnification is in a proportional relation as shown in FIG. 11. Further, the initial pressure $P_0$ is varied by the then atmospheric pressure in the relation of the aforementioned equation (8) and therefore, the atmospheric pressure PA during that measurement is also measured. The initial magnification $M_0$, the initial pressure $P_0$ and the atmospheric pressure PA during the measurement are stored in the CPU 70 or the computer 43 in the control device 32. As shown in FIG. 11, if the initial pressure providing the initial magnification $M_0$ is measured when the atmospheric pressure P is greater than PA, it is a value $P_{01}$ smaller than $P_0$, and if the initial pressure providing the initial magnification $M_0$ is measured when the atmospheric pressure P is smaller than PA, it is a value $P_{02}$ greater than $P_0$. This is because the pressure in the air chamber h is controlled by the control device 32 so as to always keep a constant magnification relative to the fluctuation of the atmospheric pressure. In any case, the fluctuation amount $\Delta m$ of the magnification of the projection lens relative to the fluctuation amount $\Delta Ph'$ of the pressure in the air chamber h is constant and therefore, here, $\Delta m$ is defined as $\Delta m = -K_1 \cdot \Delta Ph'$, where $K_1$ is a constant which can be found from measurement or calculation in designing of the projection lens.

Figure 12:
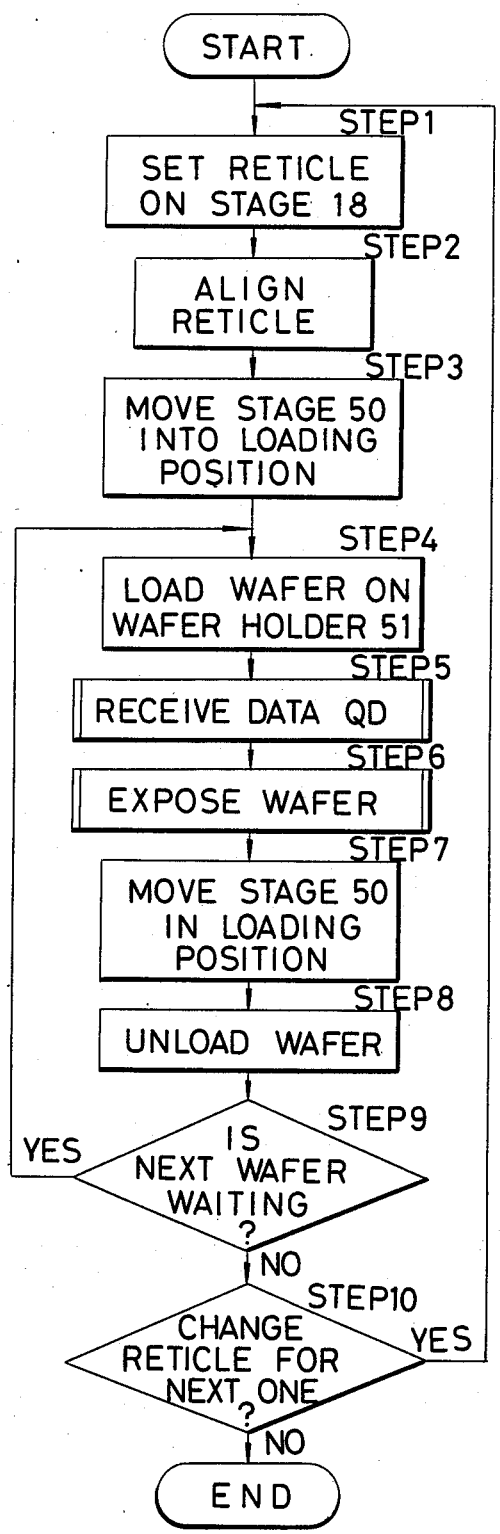
FIGS. 12 and 13 are flow charts for controlling the operation of the projection exposure apparatus.

FIG. 12 shows a flow chart for controlling the sequence of the entire exposure apparatus. First, after the closing of the main switch of the exposure apparatus, the apparatus is left as it is for some time for warming up, whereafter at step 1, the reticle R is set on the holding portion 20 of the reticle stage 18. This may be effected by driving a reticle conveying device, not shown, by the command from the CPU or may be effected manually.

Then, at step 2, the CPU effects alignment of the reticle R. This is terminated by driving the actuators 21 and 22 to move the reticle R so that the control point of the pattern area Pr of the reticle passes through the optic axis.

Next, at step 3, the CPU moves the two-dimensionally movable stage 50 into the loading position. This may be accomplished by reading the data of the laser interferometer 58 and the data of the laser interferometer 59 by the CPU, and controlling the actuators 55 and 56 so that the value of the coordinates determined on the basis of the two data is the loading position.

Figure 13:
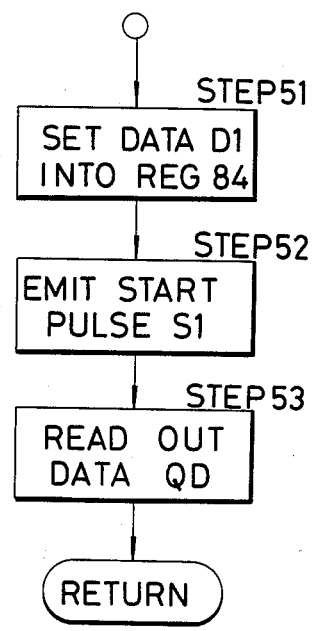

When the movable stage is positioned at the loading position, the wafer loading of step 4 is started. In this step, a wafer having a photosensitive material applied thereto is supplied onto the wafer holder 51 from a wafer conveying device, not shown. Along with step 4, at step 5, the data QD from the photoelectric detector 60 is input. This step 5 operates, for example, in accordance with the flow chart shown as a sub-routine in FIG. 13. When the movable stage is positioned at the loading position at step 3, at step 51 the CPU sets in the register 84 the data $D_1$ for opening the shutter 13 for a predetermined time.

Then, the CPU puts out the start pulse $S_1$ and effects the opening of the shutter 13. Thus, the voltage-frequency converter 82 puts out a pulse signal Sf corresponding to the intensity of the exposure light illuminating the reticle R, and the pulse number thereof is counted by the counter 83. As previously explained, when in the comparator 85 the count value of the counter 83 and the data $D_1$ of the register 84 become coincident with each other, the shutter 13 is closed. When the shutter is in its fully open state, at the next step 53 the CPU reads out the data QD and stores the value thereof in a memory.

Then, the CPU 70 starts the step 6, i.e., the exposure of wafers by the step and repeat system. When the exposure of a wafer is terminated, the CPU moves the movable stage 50 into the loading position at step 7, and effects the unloading of the wafer W from the wafer holder 51 at step 8.

At step 9, whether the exposure of the next wafer should be effected is judged and when a new wafer is to be exposed, step 4 and so on are again repeated.

When a new wafer is not to be exposed, the program proceeds to step 10 and a question as to whether the change of the reticle is necessary or unnecessary is put to the operator through the terminal device 74. When the operator's answer is Yes, the program returns to step 1 and the reticle so far used is carried out and a new reticle is set.

In the manner described above, the sequence of the exposure apparatus is controlled, and in the meantime, the control device corrects the fluctuation of the magnification of the projection lens 30 every moment.

This correcting operation will now be described on the basis of FIGS. 14, 15 and 16.

Before the sequence of the exposure apparatus as shown in FIG. 12 is started, the CPU puts out to the present register 92 of the duty detecting circuit of FIG. 10 a data $D_2$ for determining a predetermined time measured by the counter 91. This predetermined time is a value sufficiently smaller than the time constants TS1 and TS2 of the rising and falling of the magnification fluctuation characteristic, for example, ten seconds. The counter 91 subtracts the pulses of the clock signal from the oscillator 90, and puts out a zero signal $S_3$ when the count value of this counter has become zero. Accordingly, the zero signal $S_3$ is put out every 10.0 seconds after the closing of the main switch of the apparatus.

Figure 14:
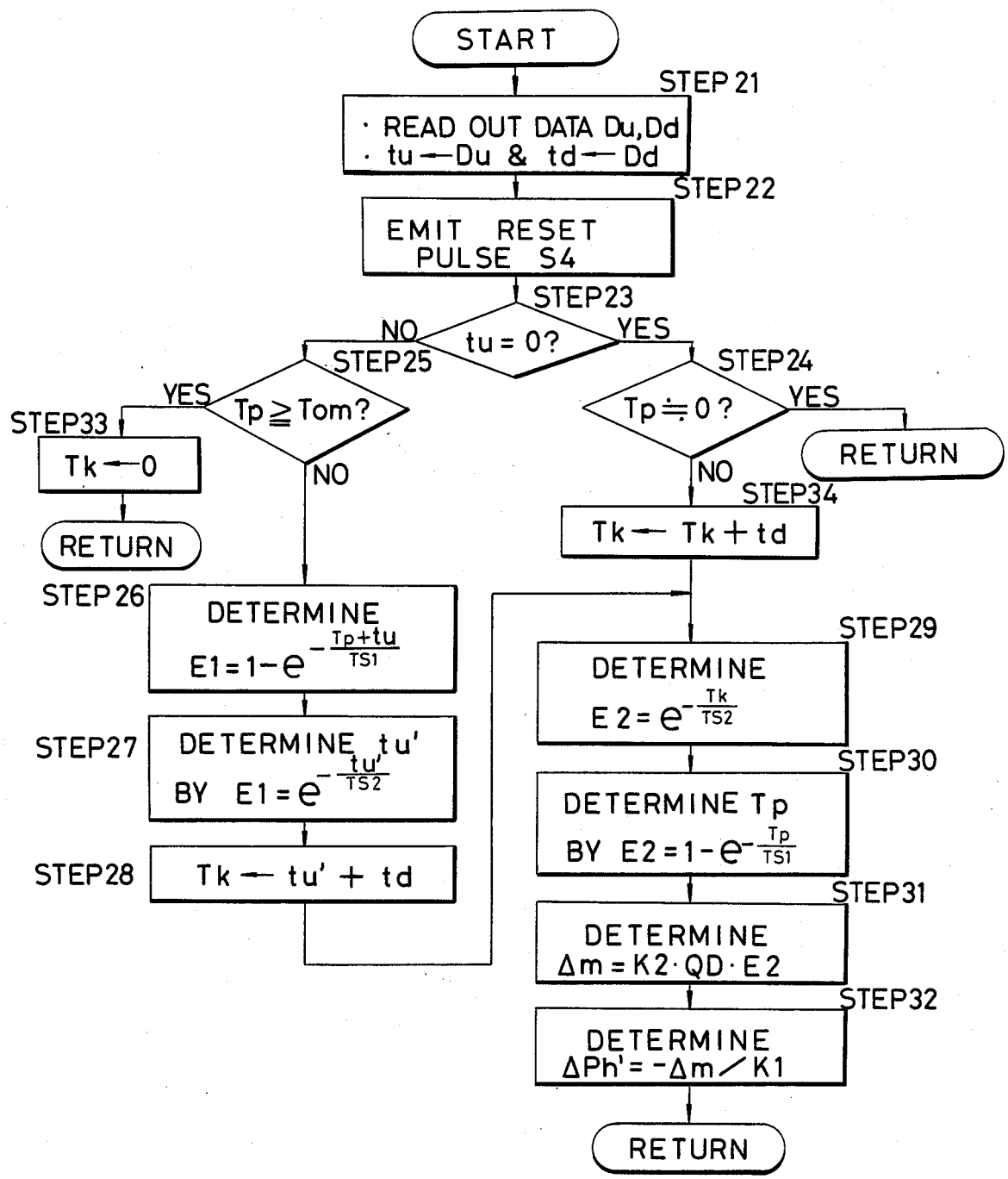
FIG. 14 is a flow chart for detecting the magnification fluctuation of the projection lens.

This zero signal $S_3$ applies interruption to the CPU, which thus executes the flow chart of FIG. 14.

Said predetermined period is the time rate at which the exposure light enters the projection lens, that is, the sampling period which provides the standard for determining the duty. Where during that sampling period of ten seconds, neither the start pulse $S_1$ nor the coincidence pulse $S_2$ is generated, that is, the opening and closing of the shutter 13 is never effected and the exposure light does not enter the projection lens, the output signal of the flip-flop 93 remains at the logic value "L" and the count value of the counter 98 does not vary since the time when the reset pulse $S_4$ has been received, and the data Du becomes zero. On the other hand, after the reception of the reset pulse $S_4$, the counter 99 counts the clock signal with the counting of the counter 91, and at the point of time whereat the sampling period terminates, the data Dd becomes a value representative of ten seconds (100 if the clock signal is 10 pulses/sec.).

The above-described state is kept until the exposure apparatus begins to expose the first wafer.

Figure 15:
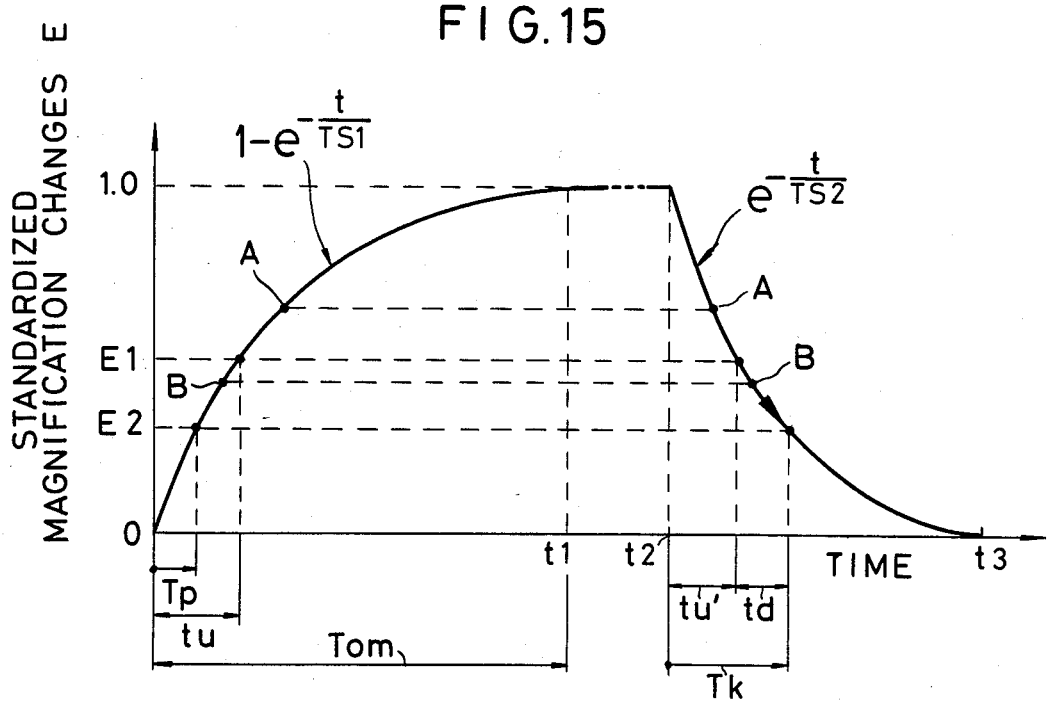
FIG. 15 is a graph showing the magnification fluctuation characteristic of the projection lens.

The characteristic curve shown in FIG. 15 is depicted by standardizing the magnification fluctuation characteristic of FIG. 7, and in this graph, the saturation point of the magnification fluctuation is 1.0 and the standardized magnification fluctuation amount is expressed by E ($0 \leq = E < 1.0$).

Assume that when the fluctuation amount $E=0$, the sampling period is started and during this period, the shutter is opened for a time $t_u$ and is closed for the succeeding time $t_d$. During the first time $t_u$, the magnification fluctuation amount E is varied from 0 to E1 along the characteristic curve $1-e^{-t/TS1}$ by the incidence of the exposure light. During the succeeding time $t_d$, the exposure light is not given and therefore the fluctuation amount E is varied from E1 to E2 along the characteristic curve $e^{-t/TS2}$. Thus, the final magnification fluctuation amount during the sampling period is E2. Where an exposure time $T_p$ long enough to give this fluctuation amount E2 from the starting point of the sampling period at the fluctuation amount $E=0$ is supposed, it will be seen that the time $T_p$ is a variable determined by the magnitude of the magnification fluctuation amount at the start of the sampling period and the duty.

The magnification fluctuation by the light entering the projection lens does not occur during the time until the exposure of the first wafer is started and therefore, the initial magnification $M_0$ is kept. Accordingly, the CPU substitutes the variable $T_p=0$ as the initial state. The time Tom until the magnification fluctuation is saturated from the initial magnification is pre-stored in the CPU. This time Tom is determined, for example, as the time until the value of 99% of the saturation point is reached.

Figure 16:
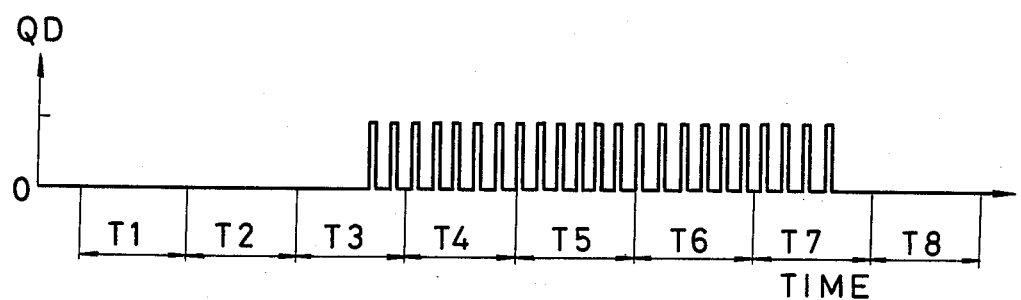
FIG. 16 is a time chart showing the relation between the exposure operation of the projection exposure apparatus and sampling periods.

Assuming that the zero signal $S_3$ has been produced before the step and repeat type exposure is effected on the first wafer as shown in FIG. 16 and when the sampling period $T_1$ (ten seconds) has elapsed, the CPU executes the step 21 of FIG. 14 by interruption. The CPU reads the data Du and Dd and converts them into times tu and td and stores the same, whereafter at the next step 22, it puts out a reset pulse $S_4$. Immediately after the termination of the sampling period $T_1$, tu=0 and td=10.0, and at step 23, the CPU judges that tu=0 is true, and proceeds to step 24. At step 24, the CPU judges whether the variable $T_p$ is substantially zero (for example, a value smaller than 0.1 second). Since the variable $T_p$ remains to be in its initial state (zero), it is judged as true and the interruption process is terminated, and the CPU returns to the main program shown in FIG. 12. Thus, the quantity of light entering the projection lens is zero during the sampling period $T_1$ and therefore, the interruption process is terminated without the operation and control for correcting the pressure in the air chamber h of the projection lens being effected.

From immediately after the CPU has put out the reset pulse $S_4$ at step 22, the counters 98 and 99 operate during the next sampling period $T_2$ in the same manner as during the sampling period $T_1$, and after the lapse of the sampling period $T_2$, the CPU receives the zero signal $S_3$ and again executes step 21 and so on. During the sampling period $T_2$ as well, tu=0, td=10.0 and Tp=0 and therefore, the CPU returns to the main program without effecting the operation and control for correction.

It is to be understood that the step and repeat exposure of the step 26 shown in FIG. 12 has been started during the next sampling period $T_3$. Thus, after the lapse of the sampling period $T_3$, the value of the data Du is no longer zero and the CPU executes steps 21 and 22, whereafter at step 23, tu=0 is judged as false and step 25 is executed.

At step 25, the CPU compares the magnitude of the value of the variable $T_p$ with the magnitude of the time Tom. In this case, the variable Tp=0 and hence, the CPU executes step 26.

At step 26, the amount $E_1$ fluctuating during the time tu is operated on the basis of the formula $1-e^{-(t/TS1)}$ during the rising of the magnification fluctuation characteristic, as shown in FIG. 15.

The operation is effected with t in this formula being $t=T_p+tu$. The variable $T_p$ is zero at the point of time whereat this sampling period $T_3$ has elapsed and therefore, $E_1=1-e^{-(tu/TS1)}$. Then, at step 27, the CPU finds the time tu' for obtaining the fluctuation amount $E_1$ in the characteristic during the falling, on the basis of the fluctuation amount $E_1$ now found. This is found from $tu'=(-TS2)\ln E_1$ (where ln is natural logarithm) obtained by reversely operating an equation $E=e^{-(tu'/TS2)}$.

Then, the CPU executes step 28 and substitutes the sum of the integration time td for which the shutter 13 has been closed during the sampling period $T_3$ and the time tu' into a variable Tk.

Step 29 is for finding the fluctuation amount $E_2$ corresponding to the time represented, by the variable Tk in the characteristic during the falling by operation of $E_2=e^{-(Tk/TS2)}$.

The next step 30 is for finding the time for obtaining the fluctuation amount $E_2$ on the characteristic curve during the rising, and this is found from $t=(-TS1)\ln(1-E_2)$ obtained by reversely operating an equation $E_2=1-e^{-(t/TS1)}$. The time t thus found is substituted into the variable $T_p$.

The fluctuation amount $E_2$ thus, found represents the standardized fluctuation amount from the initial magnification $M_0$ generally varied during the sampling period $T_3$ by the ratio between the time tu and the time td. Then, at step 31, the CPU multiplies the fluctuation amount $E_2$ found by the current operation and the value of the data QD found at the step 5 of FIG. 12, with a constant $K_2$, and thereby finds the fluctuation amount $\Delta m$ to be corrected relative to the initial magnification $M_0$.

At the next step 32, the CPU finds a pressure variation amount $\Delta Ph'$ corresponding to the fluctuation amount $\Delta m$ by operation of $\Delta Ph'=-\Delta m/K_1$, puts out this pressure variation amount $\Delta Ph'$ to the computer 43 of FIG. 5 through a data bus DB1 and returns to the main program. Upon receipt of the information of this variation amount $\Delta Ph'$, the computer 43 monitors the output signal from the pressure sensor 41 and operates the barometric controller 35 so that it varies by $\Delta Ph'$ from the so far maintained pressure in the air chamber h, i.e., the pressure corrected relative to the fluctuation of the atmospheric pressure.

In the manner described above, the magnification fluctuation amount corresponding to the total quantity of light entering the projection lens 30 is corrected during the sampling period $T_3$, and the apparatus operates so as to keep the initial magnification $M_0$. However, the timing at which the pressure in the air chamber h is actually controlled at step 32 is in the sampling period $T_4$ next to the sampling period $T_3$.

Now, when the next sampling period $T_4$ elapses and the zero signal $S_3$ is again produced, the CPU executes the interruption process from step 21.

At this time, the variable $T_p$ assumes any value other than zero during the sampling period $T_3$ and therefore, the value of $E_1$ operated at step 26 is the point A of FIG. 15 and the value of $E_2$ operated at step 29 is the point B of FIG. 15.

Thus, during the sampling periods $T_4$, $T_5$, $T_6$, and $T_7$ within the exposure period of the step and repeat system, the magnification fluctuates in succession. Of course, during each of these sampling periods, the pressure in the air chamber h is corrected in accordance with the fluctuation amount $\Delta m$ and therefore, the magnification of the projection lens is kept at the initial magnification $M_0$.

When steps 21, 23, 25-32 are repeated as described above, the value of the variable $T_p$ operated at step 30 will soon become greater than Tom. Tom corresponds to the time until the magnification fluctuation characteristic is saturated, and this means that the magnification will not fluctuate even if any further exposure light enters the projection lens when $T_p$ is greater than Tom. Thus, in such a state, at step 25, $T_p>$ Tom is judged as true and at step 33, zero is substituted into the variable Tk, whereafter the CPU returns to the main program without correcting the pressure in the air chamber h. On the other hand, as shown in FIG. 16, during the sampling period $T_8$ immediately after the exposure of a wafer has been terminated, for example, tu=0 and td=10.0 and the variable $T_p$ is not zero and therefore, after step 24, step 34 is executed. Step 34 is for making the value of the variable $T_k$ found during the immediately preceding sampling period $T_7$ plus the time td into a new value of the variable $T_k$.

Assuming that the magnification fluctuation characteristic is saturated during the sampling period $T_7$, zero is substituted into the variable $T_k$ at step 33 and therefore, at step 34, the variable $T_k$ becomes $t_d$.

Thereafter, steps 29-32 are likewise executed. Thus, if the opening of the shutter 13 is not effected even after the sampling period $T_8$, the pressure in the air chamber h is corrected every sampling period along the characteristic of the falling of the magnification fluctuation characteristic in accordance with steps 21, 24, 34, 29 and 32. Soon, due to the increase of the variable $T_k$ by step 34, $E_2$ becomes approximate to zero at step 29 and the variable $T_p$ also becomes approximate to zero at step 30 and therefore, when step 21 and so on are then repeated, $T_p$ is judged as $T_p \approx 0$ at step 24 and the correction of the pressure in the air chamber h is stopped. This timing corresponds to the time $t_3$ in FIG. 15.

In the foregoing description, it has been described that the design is such that the quantity of exposure light entering the projection lens which is determined by the pattern size and transmission factor of the reticle R and the intensity of light of the light source is detected by the photoelectric detector 60 and the magnification fluctuating in accordance with the entry or interception of the exposure light is successively corrected by controlling the pressure in the air chamber h. Of course, focus fluctuation, i.e., fluctuation of the position of the imaging plane, is induced by the entry or interception of the exposure light. The characteristic of the focus fluctuation by the entry of the exposure light is also entirely similar to FIGS. 7 and 15 and therefore, at step 31 in the flow chart of FIG. 14, the fluctuation amount $\Delta z$ relative to the initial position $Z_0$ of the imaging plane is found by operation of $\Delta z = K_3 \cdot QD \cdot E_2$ (where $K_3$ is a constant).

If, at step 32, the pressure $\Delta Pn'$ in the air chamber n to be varied is found by operation of $\Delta Pn' = -\Delta z/K_4$ (where $K_4$ is a constant) and the pressure in the air chamber n is corrected by this Pn', the focus position will always be kept at the initial position $Z_0$. In the above-described embodiment, the design is such that the CPU processes the program shown in FIG. 14 by interruption, but if a microprocessor is provided, for example, in the computer 43 in the control device so that the program may be executed by this microprocessor, the burden of the CPU will be reduced and high-speed processing will be possible without the sequence control shown in FIG. 12 being affected.

As is apparent from Table 2, where the magnification is to be controlled by varying the pressure only in the air chamber h, fluctuation of the focus position also occurs though minute ($-0.03$ μm). Therefore, if the amount of the focus fluctuation cannot be neglected in the relation with the depth of focus when the pressure in the air chamber h is varied greatly, the pressure in the air chamber n may also be corrected at the same time. This also holds true in a case where the focus position is controlled by varying the pressure in the air chamber n. The sampling period need not be ten seconds, but if it is made shorter, precise magnification correction can be accomplished. Also, if the sampling period is longer than 10 seconds, the burden of the CPU required for the operation process, control, etc. will be reduced. In any case, if the sampling period is sufficiently shorter than the time constants TS1 and TS2 in the magnification fluctuation characteristic, correction will be possible following the fluctuation. A second embodiment of the present invention will now be described.

In the second embodiment, instead of the exponential operation in the program of FIG. 14, a function table prepared in advance on a memory is referred to enhance the speed of processing and also, similar control is made possible even in a case where the fluctuation characteristic cannot be approximated by an exact exponential function.

FIG. 17 shows the characteristic during the rising of the standardized fluctuation characteristic in the form of a table. In FIG. 17, the standardized fluctuation amount is divided equally into fifty parts, and with respect to the rising of the characteristic curve, times TA1, TA2, ... TA50 corresponding to 0.02 each are measured or found by experiment and are shown in Table 3 below. Time TA50 corresponds to Tom shown in FIG. 15. On the other hand, the time when the fluctuation amount E is 1.0 is time zero and the lapse times during which the fluctuation amount E reduces by 0.02 each from this are found as TB1, TB2, ..., TB50 and are shown in Table 4 below.

TABLE 3

| E | TIME |
|---|------|
| 0 | 0 |
| 0.02 | TA1 |
| 0.04 | TA2 |
| 0.06 | TA3 |

TABLE 3-continued

| E | TIME |
|---|------|
| 0.08 | TA4 |
| 0.10 | TA5 |
| 0.11 | TA7 |
| . | . |
| . | . |
| . | . |
| 0.94 | TA47 |
| 0.96 | TA48 |
| 0.98 | TA49 |
| 1.00 | TA50 |

TABLE 4

| E | TIME |
|---|------|
| 0 | TB50 |
| 0.02 | TB49 |
| 0.04 | TB48 |
| 0.06 | TB47 |
| 0.08 | TB46 |
| 0.10 | TB45 |
| 0.11 | TB44 |
| . | . |
| . | . |
| . | . |
| 0.94 | TB3 |
| 0.96 | TB2 |
| 0.98 | TB1 |
| 1.00 | 0 |

These tables are used instead of the steps 26–30 and 34 of FIG. 14, for example. When entry of the exposure light takes place during a certain sampling period from the state in which the magnification fluctuation by the entry of the exposure light is not present in the prbjection lens (E=0), read-in of the data Du and Dd is effected. From Table 3, a time corresponding to the time tu is searched. That time is, for example, TA2. In Table 3, a value of E corresponding to the time TA2, i.e., 0.04, is found out. Thereafter, in Table 4, the time TB48 corresponding to the value 0.04 is searched. The time td of the data Dd is added to the time TB48. 20 is to be understood that the value of the addition is substantially equal to the time TB49 in Table 4, for example. A value 0.02 corresponding to the time TB49 corresponds to the amount fluctuated from the initial magnification $M_0$ or the initial position $Z_0$ during that sampling period, and the pressures in the air chambers h and n are corrected on the basis of this value 0.02. Assuming that the entry of the exposure light into the projection lens has taken place during the next sampling period as well, the time corresponding to the previous value 0.02 of E is found from Table 3, and the value of the addition of the time TA1 and the time tu is calculated. It is to be understood that the value of the addition is equal to the time TA4, for example. Thereafter, similarly to the previous operation, E=0.08 is found out in Table 3, and the time corresponding to TB46+td, for example, TB47, is found in Table 4, and the corresponding value 0.06 of E is obtained.

Since this value 0.06 corresponds to the fluctuation amount from the initial magnification $M_0$ or the initial position $Z_0$ during the next sampling period, the pressures in the air chambers h and n are corrected on the basis of this value 0.06.

As described above, according to the second embodiment, basically the table searching operation and the addition operation are only required and therefore, very high-speed processing becomes possible. Moreover, whatever the fluctuation characteristic may be, the tables can be prepared in advance by experiment or measurement and thus, an entirely similar effect can be obtained without reducing the processing speed.

Also, where the value between adjacent numerical values in Tables 3 and 4 is to be found, line interpolation may be effected.

A third embodiment of the present invention will now be described. The third embodiment is identical to the first and second embodiments in that the magnification fluctuation amount and the focus fluctuation amount of the projection lens by the entry of the exposure light therein are detected, but differs from the first and second embodiments in that correction of the magnification fluctuation is accomplished by changing the spacing between the reticle R and the projection lens and that correction of the focus fluctuation is accomplished by changing the spacing between the projection lens and the wafer W.

Where the apparatus has as the projection lens an optical system in which the reticle side, i.e., the object side is a non-telecentric system and the wafer side, i.e., the image side is a telecentric system, if the reticle R is vertically moved along the optic axis of the projection lens, the size of the projected image on the wafer W varies in accordance with the amount of vertical movement of the reticle. That is, even if the magnification of the projection lens is constant, the overall projection magnification (the ratio of the size of the projected pattern on the wafer W to the size of the pattern on the reticle R) can be varied.

Therefore, if the reticle stage 18 shown in FIG. 2 is displaced in Z-direction by the actuator 23 by an amount corresponding to the magnification fluctuation amount detected during each sampling period, the magnification fluctuation of the projection lens itself by the entry of the exposure light thereinto can be offset to keep the overall projection magnification always constant as in the first and second embodiments. That is, the size of the pattern image projected onto the wafer W can always be kept at a predetermined value. A similar effect may be obtained even if a piezo element is used as the actuator 23 and the voltage applied to this piezo element is controlled in accordance with the magnification fluctuation amount of the projection lens.

Also, as regards the focus fluctuation, the focus fluctuation amount Δz by the entry of the exposure light into the projection lens may be found as described with respect to the previous embodiments, whereafter the Z stage 54 may be displaced in Z-direction so that the value of the detection signal from the photosensor 66 shown in FIG. 1 may shift from zero (initial position Z₀) by a value corresponding to the fluctuation amount Δz. If this operation is effected along with the exposure operation of the step and repeat type, the projected image of the pattern of the reticle will be exposed while being accurately focused to the whole chip on the wafer W. Now, in the above-described embodiments, it has been described that the time characterictic (fluctuation characteristic) of the variation in magnification can be approximated by formulas (10) and (11), but if such characterictic is approximated by linear coupling of a plurality of exponential terms, it will better coincide with the characteristic measured by experiment. For example, if the variation in magnification during the rising is represented by $$\Delta M \cdot \left\{ 1 - \left( a \cdot e^{-\frac{t}{TSa}} + b \cdot e^{-\frac{t}{TSb}} + c \cdot e^{-\frac{t}{TSc}} \right) \right\} \quad (12)$$

and the variation in magnification during the falling is represented by $$\Delta M \cdot \left\{ \left( d \cdot e^{-\frac{t}{TSd}} + e \cdot e^{-\frac{t}{TSe}} + f \cdot e^{-\frac{t}{TSf}} \right) \right\} \quad (13)$$

and these formulas are represented by the sum of three exponential terms, there will be obtained a better degree of approximation. Here, coefficients a, b, c, d, e, f, TSa, TSb, TSc, TSd, TSe and TSf are determined so as to be coincident with the curve obtained by experiment.

A greater number of exponential terms may result in a better degree of approximation but it takes much trouble to determine the coefficients and therefore, it is desirable to determine the coefficients by the number of terms which will ensure suitable accuracy of approximation.

Another method of finding the magnification fluctuation amount relative to the quantity of incident light is shown in FIG. 18. Let it be assumed that of the sampling periods $T_1$-$T_6$, during the sampling periods $T_2$, $T_3$ and $T_4$, the exposure light has entered the projection lens at the same duty ratio and that the magnification has been the initial magnification $M_0$ till the lapse of the sampling period $T_1$. Upon termination of the sampling period $T_2$, a step characteristic A in which the value decreases exponentially with time in accordance with the thermal time constant TS of the projection lens from the initial value $E_1'$ determined on the basis of the time tu (tu≠0), the time td and the data QD (the quantity of incident light) is determined. Let it be assumed that during the sampling period $T_2$, the magnification has varied by an amount corresponding to the initial value $E_1'$ and has fluctuated to a magnification $M_1$. What has been described just above is likewise effected during the sampling periods $T_3$ and $T_4$, and step characteristics B and C are determined. The values of the step characteristics A, B and C are added together to find a characteristic D. By utilization of this characteristic D, upon termination of the sampling period $T_2$, the magnification is varied into the magnification $M_1$ corresponding to the initial value $E_1'$ of the step characteristic A, and upon termination of the sampling period $T_3$ (i.e., at the start of the sampling period $T_4$), the magnification is varied into the magnification $M_2$ corresponding to the value of the sum of the value of the step characteristic A and the value of the step characteristic B, and upon termination of the sampling period $T_4$ (i.e., at the start of the sampling period $T_5$), the magnification is varied into the magnification $M_3$ corresponding to the value of the sum of the values of the step characteristic A, B and C.

Thus, if in the characteristic D, an envelope combining the values at the points of time whereat the sampling periods $T_1$-$T_6$ terminate is defined as the fluctuation characteristic M(t) of the magnification M and correction of the pressures in the air chambers h and n of the projection lens 30 and vertical movement of the reticle R and wafer W are effected in accordance with the fluctuation characteristic M(t), there will be obtained an effect similar to that of the aforedescribed embodiments.

If, in each embodiment of the present invention, the entire exposure apparatus or the projection lens 30 is contained in a constant pressure chamber and isolated from the atmosphere, the magnification of the projection lens will always be kept at the initial magnification $M_0$. Therefore, it is not always necessary for the control device 32 to correct the pressures in the air chambers h and n relative to the fluctuation of the atmospheric pressure.

Also, in each embodiment, control is effected so as to keep the initial magnification $M_0$ by changing the pressures in the air chambers or mechanically moving up and down the reticle R and wafer W. However, if control is effected more positively so that the magnification is a magnification greater or smaller by a predetermined amount than the initial magnification $M_0$, even if the size of the chip on the wafer W is minutely varied by the expansion or contraction of the wafer W, the size of the projected image of the pattern to be superposedly printed can be accurately adjusted to the size of the chip and therefore, exposure processing of very high superposition accuracy becomes possible.

Further, in the above-described embodiments, the magnification fluctuation is corrected when the temperature of the lens is changing every moment, but as a matter of course, the situation is similar to that in the case of the above-described embodiments even when the lens is in a thermally balanced state. For example, after the exposure of the wafer has been continuously effected for more than one hour, the thermally balanced state is reached and therefore, in such case, the unit time (sampling period) for calculating the amount of correction may be one minute or more. In that case, as regards the method of calculating the amount of correction, the time variation of the rising or falling by a variation in heat need not be taken into account. That is, the magnification fluctuation amount $\Delta M$ at the satuation point relative to the data QD of the quantity of incident light (incident energy) of the projection lens detected by the photoelectric detector 60 is found from the characteristic shown in FIG. 8, and the found fluctuation amount $\Delta M$ multiplied by the value $tu/(tu+td)$ of the rate of the time ta to the sampling period may be regarded as the fluctuation amount $\Delta m$.

Other modifications of the present invention will now be described briefly.

The photoelectric detector 60 may be disposed anywhere on the two-dimensionally movable stage if it does not expose the wafer at that position when it receives the exposure light. A two-dimensional photoarray such as CCD is provided as the photoelectric detector and, even if the numbers of light-receiving elements constituting the picture elements of this two-dimensional photoarray receive the exposure light passed through the projection lens and that put out photoelectric signals of a predetermined level or more is detected and that number is treated as the data QD, there will be obtained a similar effect. A similar effect will also be obtained even if a light-receiving element having a pinhole or a minute slit opening in the light-receiving surface, thereof is provided as the photoelectric detector and the two dimensional movable stage is moved so that the pin-hole or the slit opening two-dimensionally scans the projected optical image of the pattern of the reticle R, whereby the quantity of exposure light passing through the projection lens is found.

Further, where the size of the image of the pattern area Pr projected by the projection lens is larger than the size of the light-receiving surface of the photoelectric detector 60, if a plurality of photoelectric detectors are cemented together so that the light-receiving surfaces thereof are flush with one another and the photoelectric signals of the photoelectric detectors are added together by an adding circuit, the quantity of incident light (incident energy) to the projection lens can be detected.

Although the above-described photoelectric detector is disposed so that the projected image is formed on the light-receiving surface thereof, this is not always necessary, but if the detector can detect all of the quantity of incident light passed through the projection lens, the light-receiving surface and the imaging plane of the projection lens need not be coincident with each other.

Also, even where the size of the light-receiving surface of the photoelectric detector is smaller than the size of the projected image, if all of the light of the projected optical image is condensed and caused to enter the light-receiving surface by the use of a condensing lens, the light-receiving surface can be regarded as being larger than the projected image.

Figure 19:
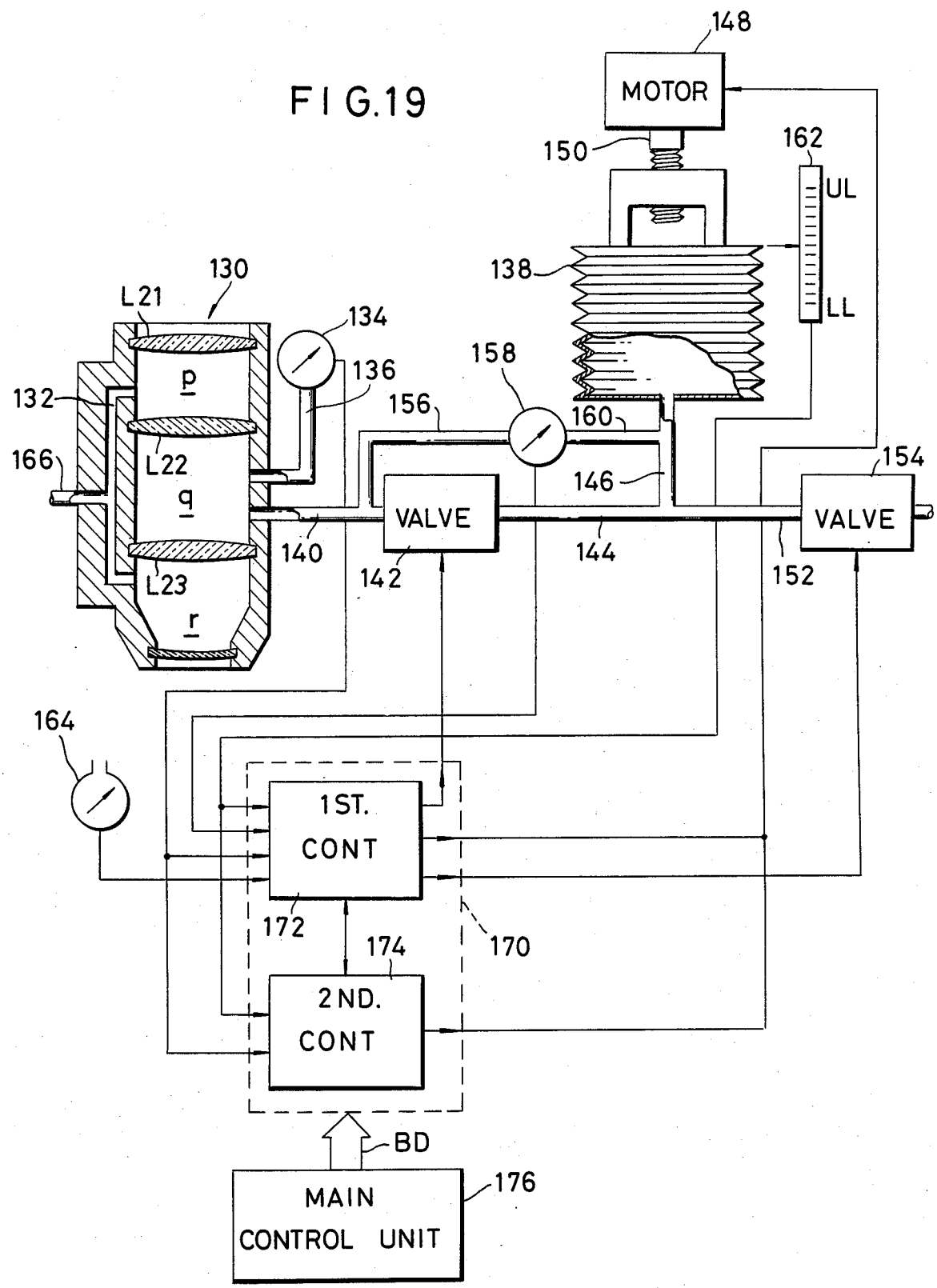
FIG. 19 schematically shows the construction of a pressure control device.

Another embodiment of the control device for controlling the air pressure in the projection lens will be described below. A control device in which, as compared with the above-described control device 32, the facilities for the supply and discharge of gas are compact and the supply and discharge of gas can be achieved very efficiently is shown in FIG. 19. A projection lens 130 is depicted in a simplified manner and typically has four lens elements L21, L22, L23 and L24. Air chambers p, q and r isolated from the atmosphere are formed between the lens elements. In the present embodiment, the chambers p and r communicate with each other by a pipe 132 so that the pressures in the chambers p and r are equal to each other. The pressure in the chamber q is positively controlled to thereby adjust the optical characteristic of the projection lens 130. The pressure in the chamber q is detected by a pressure sensor 134 through a pipe 136. This pressure sensor detects the pressure in absolute pressure and normally puts out a detection signal corresponding to that pressure, for example, in units of mmHg. The air chamber q further communicates with a bellows pump 138 through a pipe 140, and electromagnetic valve 142 and pipes 144, 146. The bellows pump 138 has its volume varied by its expansion and contraction, which is accomplished by a pump driving portion comprising a motor 148 and a feed screw 150 for vertically moving one end of the pump. The electromagnetic valve 142 changes over the blocking and opening of the communication between the pipe 140 and the pipe 144, namely, the communication between the chamber q and the pump 138. A pipe 152 has one end thereof coupled to the connection between the pipe 144 and the pipe 146, and has the other end thereof open to the atmosphere through an electromagnetic valve 154. The valve 154 changes over the opening and blocking of the communication between the atmosphere and the pipe 152. A pipe 156 has one end thereof coupled to the pipe 140 and has the other end thereof coupled to a differential pressure sensor 158. One end of a pipe 160 is coupled to the pipe 146 and the other end thereof is coupled to the differential pressure sensor 158. The design is such that gas does not flow between the pipes 156 and 160. Therefore, the differential pressure sensor 158 normally puts out a detection signal corresponding to the difference between the pressure P1 in the chamber q and the pressure P2 in the bellows pump 138. This detection signal is, for example, a voltage of 0 V when the differential pressure is zero, and is a voltage of positive polarity when P1>P2, and is a voltage of negative polarity when P1<P2, and if the value of the voltage is, determined so as to correspond to the absolute value (in units of mmHg unit mmHg) of the differential pressure, it will be convenient in controlling.

A position reading sensor 162 detects the expanded or contracted position of the pump 138 and puts out a detection signal corresponding to the position thereof. This sensor is comprised, for example, of a linear encoder or the like. Since the expanded or contracted position of the pump can also be indirectly detected by the amount of rotation of the feed screw 150, a pulse generator or a rotary encoder used to control the speed of revolution of the motor 148 may also be used for the detection of the expanded or contracted position of the pump. A pressure sensor 164 detects the atmospheric pressure in absolute value (unit mmHg) and puts out a detection signal corresponding to the atmospheric pressure, and it is identical to the sensor 134.

Now, a pressure control circuit 170 includes a processor such as a microcomputer or the like and drives the motor 148 and the electromagnetic valves 142, 154 so as to adjust the pressure in the chamber q to a predetermined value on the basis of the inputting of each detection signal. This pressure control circuit 170 basically servo-controls the pump 138 so as to keep the pressure in the chamber q always at a predetermined target value by a first controller 172, and also effects the pumping operation of the pump 138 by a second controller 174. A main control unit 176 detects the total quantity of energy (variable by the transmission factors of the mask and reticle, the brightness of the lamp, the opening-closing cycle of the shutter, etc.) of the exposure light entering the projection lens 130 per unit time, calculates the magnification fluctuation amount of the projection lens per unit time from the result of the detection, and determines the pressure in the chamber q which will correct that fluctuation amount. The main control unit 176 puts out the thus determined pressure as a pressure command value BD to the pressure control circuit 170. The communicating pipe 132 of the projection lens 130 is connected to an extraneous pressure control system through a pipe 166. This pressure control system effects such control that the pressures in the chambers p and r always keep the pressure levels determined during the manufacture of the projection lens. For this purpose, the pressure control system is constructed similarly to the shown system for controlling the pressure in the chamber q. However, the main control unit 176 is unnecessary in this case.

The main control unit 176, like the above-described embodiments, repetitiaely detects the ratio of the time during which the shutter is opened to the time during which the shutter is closed, within a unit time sufficiently shorter than the time constants of the rising and falling after the main switch of the exposure apparatus has been closed. Then, the main control unit operates how long the exposure energy has entered the projection lens after the magnification has been in the state of the initial value $M_0$.

Here, to simplify the following description, it is to be understood that the magnification of the projection lens is the initial value $M_0$, the then pressure in the chamber q is P1 ($M_0$) and the pump 138 is of a volume corresponding to one half of the expansion-contraction stroke thereof. It is also to be understood that the atmospheric pressure is P3 and does not greatly vary during the operation of the exposure apparatus. It is further to be understood that the electromagnetic valve 142 is open and the electromagnetic valve 154 is closed.

Figure 20:
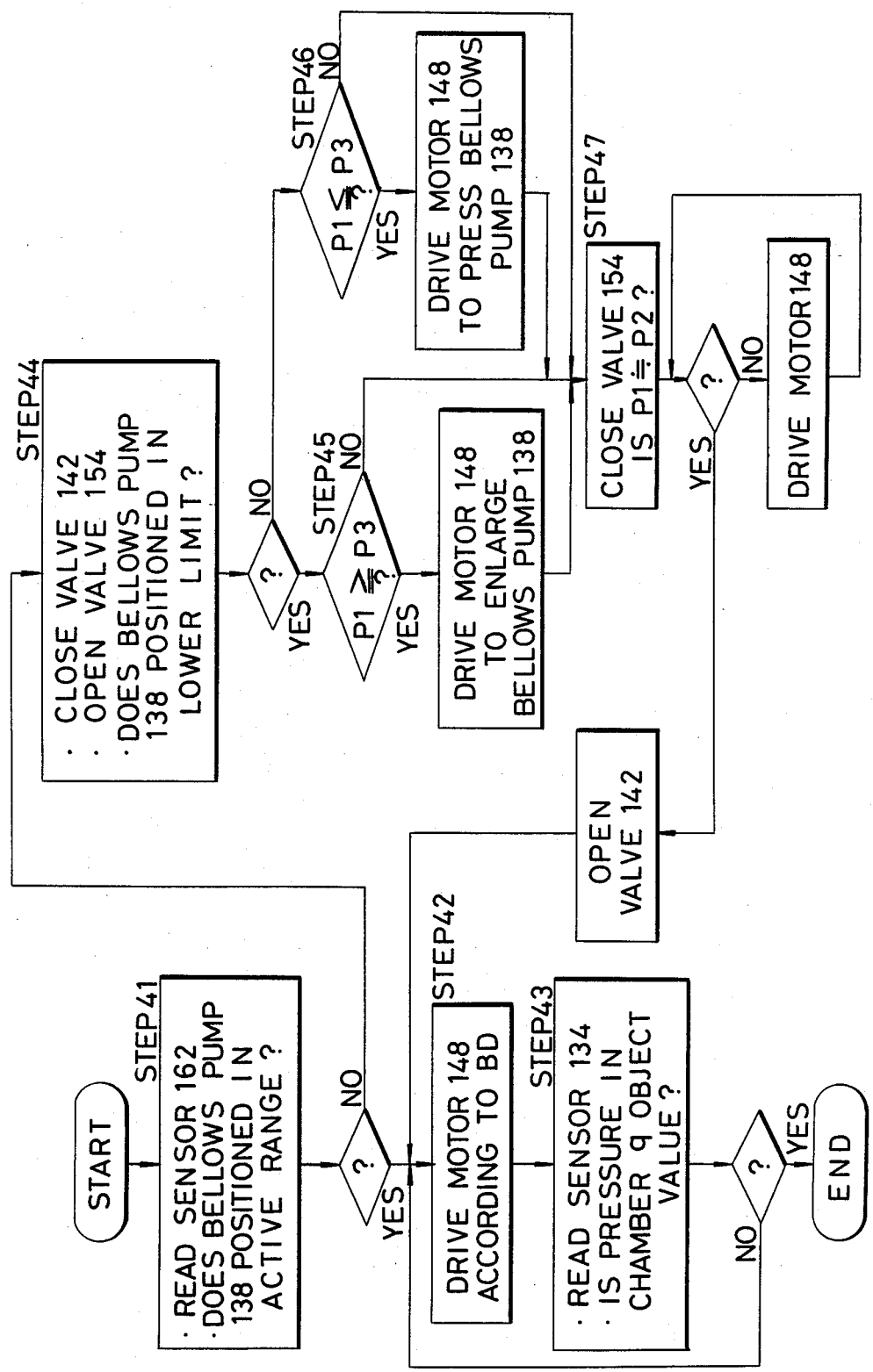
FIG. 20 is a flow chart showing the operation of the device of FIG. 19.

When the exposure operation of the exposure apparatus is started at time $t_0$, the main control unit 176 operates the magnification fluctuation amount in unit time on the basis of the ratio of the time during which the shutter is open to the unit time and the rising characteristic of FIG. 7. Since the magnification fluctuation amount and the pressure in the chamber q are substantially in a proportional relation, the main control unit 176 puts out a pressure command value BD corresponding to the pressure in the chamber q under which the fluctuation amount is corrected to zero. In response to this command value BD, the pressure control circuit 170 controls the pressure in the chamber q along the flow chart shown in FIG. 20.

At step 41, the CPU of the microcomputer provided in the control circuit 170 reads the detection signal of the sensor 162 and judges whether the bellows pump 138 is within the active range of expansion and contraction. As previously mentioned, at this point of time, the pump is of a volume corresponding to one half of the expansion-contraction stroke and therefore, the CPU judges that the pump is within the active range, and executes the next step 42.

The CPU servo-controls the driving of the motor 148 in accordance with the pressure command value BD received from the main control unit 176 and expands or contracts the bellows pump. Where the magnification is varied in a direction for increase by the entry of the exposure light into the projection lens and the magnification is varied in a direction for increase by increasing the pressure in the chamber q, the main control unit 176 puts out a pressure command value BD of such a value that the pressure in the chamber q is reduced from the initial pressure p1($M_0$) by an amount corresponding to the absolute value of the magnification fluctuation amount.

When the driving of the motor is started, the CPU reads the detection signal of the pressure sensor 134 at step 43 and judges whether the pressure in the chamber q has reached a target value. The driving of the motor is continued until the target value is obtained. Thus, when, for example, the bellows pump 138 expands and its volume increases, the pressures in the pump 138, the pipes 146, 144, 140 and the chamber q are uniformly reduced and the magnification fluctuation amount is corrected to zero.

In the manner described above, the main control unit 176 puts out the pressure amount in the chamber q to be changed from the initial pressure P1($M_0$) each time the unit time terminates and therefore, in response to the pressure command value BD produced at each unit time, the CPU repetitively executes steps 41–43. Steps 42 and 43 are boundlessly repeated so as to adjust the pressure in the chamber q as long as the expansion and contraction of the pump 138 is within the active range, thereby keeping the magnificaiton of the projection lens always at the initial value $M_0$. However, when the expansion of the pump reaches the upper limit UL during the lapse of the rising characteristic of the magnification fluctuation, that is, when the limit of the pressure reduction of the chamber q is reached, any further pressure reduction cannot be effected and the magnification adjustment following the rising characaterisitic becomes impossible. Of course, also when the contraction of the bellows pump has reached the lower limit LL, any further pressure increase cannot be effected and therefore, magnification adjustment becomes impossible. To overcome such inconvenience, the pumping operation of the bellows pump is effected in the following manner on the basis of the detection signals of the pressure sensors 134, 164 and the differential pressure sensor 158.

When, at the previous step 41, for example, the upper limit is judged, the CPU closes the electromagnetic valve 142 at step 44 and blocks the communication between the chamber q and the pump, whereafter it opens the electromagnetic valve 154 and causes the pump to communicate with the atmosphere. The operation of these electromagnetic valves 142 and 154 follows the above-mentioned order without fail.

Then the CPU judges whether the bellows pump has reached the lower limit or the upper limit of the expansion and contraction thereof and, when it judges that the bellows pump has reached the lower limit, the program proceeds to step 45 and when it judges that the bellows pump has reached the upper limit, the program proceeds to step 46. Since here the bellows pump has reached the upper limit, the CPU examines the magnitude relation between the pressure P1 in the chamber q detected by the pressure sensor 134 and the atmospheric pressure P3 detected by the pressure sensor 164, at step 46. When $P1 \leq P3$, the motor is driven to contract the bellows pump to the intermediate point of the active range or to the vicinity of the boundary point between the active range and the lower limit. This control is accomplished by servo control which drives the motor while reading the detection signal of the sensor 162. Also, when $P1 \leq P3$ is not judged at step 46, the driving of the motor is not effected. On the other hand, when it is judged at step 44 that the lower limit has been reached, the CPU judges at step 45 whether $P1 \geq P3$ and, when $P1 \geq P3$, the motor is driven to expand the bellows pump to the intermediate point of the active range or to the vicinity of the boundary point between the active range and the upper limit. when $P1 \geq P3$ is not judged, the driving of the motor is not effected.

At step 47, the electromagnetic valve 154 is closed and the communication of the bellows pump with the atmosphere is blocked. Thus, the pump is disconnected from both of the chamber q and the atmosphere and forms an independent space.

The CPU drives the motor so that the difference between the pressure P1 in the chamber q and the pressure P2 in the pump is zero while monitoring the detection signal of the differential pressure sensor 158, thereby expanding or contracting the bellows pump. That is, the CPU executes the contracting or pressure-reducing operation during the pumping operation.

At a point of time whereat the differential pressure has become zero, the CPU opens the electromagnetic valve 142 and communicates the bellows pump with the chamber q. Subsequently, the CPU executes steps 42 and 43.

We claim:

1. An apparatus for projecting the image of an object onto a substrate, comprising:
   (a) optical means for forming the image of said object on said substrate, said optical means having a plurality of optical elements and a plurality of spaces defined by said optical elements, at least one of said plurality of spaces being independent from the atmosphere;
   (b) pump means including drive means and an air chamber having a volume varied by said drive means;
   (c) first connecting means for connecting the air chamber of said pump means to said independent space of said optical means;
   (d) second connecting means for connecting the air chamber of said pump means to the atmosphere; and
   (e) control means for selectively enabling said first connecting means and said second connecting means, said control means including first control means for driving said pump means and varying the air Pressure in said independent space while said frist connecting means is enabled, and second control means for driving said pump means and varying the volume of said air chamber while said second connecting means is enabled.

2. An apparatus for projecting the image of an object onto a substrate, comprising:
   light source means providing light energy for illuminating said object;
   optical means employing light energy supplied thereto from the illuminated object for forming said image on said substrate, an optical characteristic of said optical means being varied by the light energy supplied thereto;
   means for monitoring the light energy supplied to said optical means, said monitoring means generating monitoring data during each of a plurality of predetermined periods;
   means for determining variation in the optical characteristic of said optical means, said determining means determining said variation at the end of each of said predetermined periods based upon said optical characteristic at the beginning of each period and the monitoring data generated during that period; and
   means for adjusting said image in response to said determining means.

3. An apparatus according to claim 2, wherein said optical means has a reference optical characteristic and said optical characteristic variation determined by said determining means is determined as an amount of variation relative to said reference optical characteristic.

4. An apparatus according to claim 3, wherein each of said predetermined periods is substantially shorter than the time required for said optical characteristic to vary from said reference optical characteristic sufficiently to become constant when said light energy is supplied continuously to said optical means.

5. An apparatus according to claim 2, wherein said optical characteristic includes the image magnification of said optical means and wherein said adjusting means adjusts the size of said image.

6. An apparatus according to claim 5, wherein said adjusting means includes control means acting on said optical means to change the image magnification of said optical means.

7. An apparatus according to claim 6, wherein said optical means has a plurality of lens elements and a plurality of optical elements including spaces defined by said lens elements, and said adjusting means varies the refractive index of at least one of said optical elements.

8. An apparatus according to claim 6, wherein said optical means includes a plurality of lens elements and spaces defined by said lens elements, and said control means includes means for varying the air pressure in at least one of said spaces.

9. An apparatus according to claim 2, wherein said light source means includes control means for supplying and interrupting said light energy, and said monitoring means generates data indicating the ratio of the time when said light energy is supplied to the time when said light energy is interrupted, for each of said predetermined periods.

10. An apparatus for projecting the image of an object onto a substrate, comprising:
light source means providing light energy for illuminating said objects;
optical means employing light energy supplied thereto from the illuminated object for forming said image on said substrate;
means for monitoring the light energy supplied to said optical means, said monitoring means generating monitoring data during each of a plurality of predetermined periods of unit duration;
means for producing first variation data corresponding to variation in said optical characteristic by said light energy supplied to said optical means for each of said periods and based upon said monitoring data generated during the corresponding periods;
means for storing second variation data corresponding to variation in said optical characteristic when said light energy supplied to said optical means is interrupted;
means for determining said optical characteristic at the end of each of said periods based on said first and second variation data and on said optical characteristic at the beginning of each period; and
means for adjusting said image in response to said determining means.

11. An apparatus according to claim 10, wherein said optical characteristic determined by said determining means at the end of each of said predetermined periods is used in determining the optical characteristic for the subsequent period.

12. An apparatus according to claim 11, wherein said determining means includes first means for calculating, for each of said periods, an optical characteristic variation based on the optical characteristic at the beginning of each period and on said second variation data for that period, and second means for adding the optical characteristic variation calculated by said first means for each period to the optical characteristic at the beginning of that period.

13. An apparatus according to claim 10, wherein said optical means has a reference optical characteristic and said optical characteristic determined by said determining means is determined as an amount of variation relative to said reference optical characteristic.

14. An apparatus according to claim 13, wherein each of said predetermined periods is substantially shorter than the time required for said optical characteristic to vary from said reference optical characteristic sufficiently to become constant when said light energy is supplied continuously to said optical means.

15. An apparatus according to claim 10, wherein said optical characteristic includes the image magnification of said optical means and said adjusting means adjusts the size of said image.

16. An apparatus according to claim 15, wherein said adjusting means includes control means acting on said optical means to change the image magnification of said optical means.

17. An apparatus according to claim 16, wherein said optical means has a plurality of lens elements and a plurality of optical elements including spaces defined by said lens elements, and said adjusting means varies the refractive index of at least one of said optical elements.

18. An apparatus according to claim 16, wherein said optical means includes a plurality of lens elements and spaces defined by said lens elements, and said control means includes means for varying the air pressure in at least one of said spaces.

19. An apparatus according to claim 10, wherein said light source means includes control means for supplying and interrupting said light energy, and said monitoring means generates data indicating the ratio of the time when said light energy is supplied to the time when said light energy is interrupted, for each of said predetermined periods.

20. An apparatus according to claim 10, wherein said first variation data is produced in accordance with the formula $\Delta M \cdot (1 - e - t/TS1)$ and said second variation data is produced in accordance with the formula $\Delta M \cdot e - (t/TS2)$, where $\Delta M$ is the maximum value of the variation of said optical characteristic, $e$ is a natural number, $t$ is the elapsed time, and $TS1$ and $TS2$ are constants.

21. An apparatus for projecting the image of an object onto a substrate, comprising:
light source means providing light energy for illuminating said object;
optical means employing light energy supplied thereto from the illuminated object for forming said image on said substrate, the image magnification of said optical means being varied and an imaging plane of said optical means being moved by the light energy supplied to said optical means;
means for monitoring the light energy supplied to said optical means;
means for determining the variation in the image magnification of said optical means and the movement of said imaging plate in response to said monitoring means;
means for adjusting the positional relation between said object and said optical means according to said variation in the image magnification determined by said determining means to correct the image magnification of said optical means; and
means for adjusting the positional relation between said optical means and said substrate according to said movement of said imaging plane determined by said determining means.

22. An apparatus for projecting the image of an object onto a substrate, comprising:
light source means providing light energy for illuminating said object;
optical means employing light energy supplied thereto from the illuminated object fof forming the image of said object on said substrate, the image magnification of said optical means being varied and an imaging plane of said optical means being moved by the light energy supplied to said optical means;
means for monitoring the light energy supplied to said optical means;
means for determining the variation in the image magnification of said optical means and the movement of said imaging plane in response to said monitoring means;

first adjusting means for correcting the image magnification of said optical means according to said variation in the image magnification determined by said determining means; and second adjusting means different from said first adjusting means for cancelling the movement of said imaging plane according to the movement of said imaging plane determined by said determining means.

23. An apparatus for projecting the image of an object onto a substrate, comprising:

light source means providing light energy for illuminating said object;

optical means employing light energy supplied thereto from the illuminated object for forming said image on said substrate;

shutter means opened and closed alternately for alternately permitting and preventing the supply of light energy from the illuminated object to said optical means, said optical means having an optical characteristic that increases exponentially to a substantially constant value while light energy is continually supplied to said optical means and that decreases exponentially to another substantially constant value when said light energy is no longer supplied to said optical means;

means for monitoring the light energy supplied to said optical means; and means responsive to said monitoring means for controlling said optical means in a manner that provides compensation for the exponential variation of said optical characteristic.

24. An apparatus in accordance with claim 23, wherein said monitoring means operates during a plurality of light energy sampling periods and wherein the compensation provided by said controlling means to said optical means is based upon the optical characteristic at the beginning of each period and the relative amounts of time during each period that said shutter is opened and closed.

* * * * *